US012777618B2

(12) United States Patent
Yu et al.

(10) Patent No.: US 12,777,618 B2
(45) Date of Patent: Oct. 27, 2026

(54) RADIATIVE COOLING INTERFACE FOR WEARABLE ELECTRONIC DEVICE

(71) Applicant: City University of Hong Kong, Kowloon (HK)

(72) Inventors: Xinge Yu, Kowloon (HK); Dangyuan Lei, Kowloon (HK); Jiyu Li, Kowloon (HK); Yang Fu, Kowloon (HK)

(73) Assignee: City University of Hong Kong, Kowloon (HK)

( * ) Notice: Subject to any disclaimer, the term of this patent is extended or adjusted under 35 U.S.C. 154(b) by 363 days.

(21) Appl. No.: 18/355,648

(22) Filed: Jul. 20, 2023

(65) Prior Publication Data

US 2024/0040750 A1 Feb. 1, 2024

Related U.S. Application Data

(63) Continuation-in-part of application No. PCT/CN2022/108356, filed on Jul. 27, 2022.

(30) Foreign Application Priority Data

Jul. 27, 2022 (WO) ................ PCT/CN2022/108356

(51) Int. Cl.
*H05K 7/20* (2006.01)

(52) U.S. Cl.
CPC .................................. *H05K 7/2039* (2013.01)

(58) Field of Classification Search
CPC .... H01L 2023/4037; H01L 2023/4068; H05K 7/20427; F28F 13/18; B23B 7/023
(Continued)

(56) References Cited

U.S. PATENT DOCUMENTS

2014/0366568 A1* 12/2014 Kim ...................... F28F 17/005 62/272
2016/0026213 A1* 1/2016 Li ......................... A61M 35/00 361/679.03

(Continued)

FOREIGN PATENT DOCUMENTS

CN 111455484 A 7/2020
CN 112898777 A 6/2021

(Continued)

OTHER PUBLICATIONS

Yao et al., "stretchable self-powered epidermal electronics from piezoelectric rubber for tactile sensing", Acta Phys. Sin. 31, Dec. 2020, No. 17, vol. 69.

(Continued)

*Primary Examiner* — Emmanuel E Duke
(74) *Attorney, Agent, or Firm* — Renner, Kenner, Greive, Bobak, Taylor & Weber

(57) ABSTRACT

A wearable electronic device includes a radiative cooling interface for facilitating cooling of a wearable electronic device. The radiative cooling interface is flexible and is made at least partly of a radiative cooling material that includes a polymeric matrix and one or more materials dispersed in the polymeric matrix. The radiative cooling material is operable to facilitate reflection of solar radiation in at least some solar spectrum wavelengths, when the radiative cooling material is exposed to solar radiation. The radiative cooling material is also operable to facilitate emission of thermal radiation in at least some infrared spectrum wavelengths.

25 Claims, 33 Drawing Sheets

(58) Field of Classification Search
USPC ....................................... 361/679.03; 165/185
See application file for complete search history.

(56) References Cited

U.S. PATENT DOCUMENTS

| | | | | |
|---|---|---|---|---|
| 2016/0049569 | A1* | 2/2016 | Negrin | G06F 1/163 320/101 |
| 2017/0235341 | A1* | 8/2017 | Huitema | G04G 17/08 361/679.03 |
| 2019/0042030 | A1* | 2/2019 | Saaski | B29C 39/12 |
| 2019/0056184 | A1* | 2/2019 | Han | F28F 13/185 |
| 2019/0086164 | A1* | 3/2019 | Yang | B29C 48/9135 |
| 2021/0131708 | A1* | 5/2021 | Dai | C08K 3/013 |
| 2023/0115141 | A1* | 4/2023 | Halyal | H02J 50/12 455/41.1 |

FOREIGN PATENT DOCUMENTS

| | | | | |
|---|---|---|---|---|
| CN | 113561578 | A | 10/2021 | |
| CN | 113913958 | A | 1/2022 | |
| WO | 1993016878 | A | 9/1993 | |
| WO | WO-2019152172 | A1 * | 8/2019 | H10W 40/00 |

OTHER PUBLICATIONS

International Search Report for PCT/CN2022/108356.
Written Report for PCT/CN2022/108356.

* cited by examiner

RADIATIVE COOLING INTERFACE FOR WEARABLE ELECTRONIC DEVICE

CROSS REFERENCE TO RELATED APPLICATION

The application is a continuation-in-part of International Application No. PCT/CN2022/108356, filed on Jul. 27, 2022.

TECHNICAL FIELD

The invention relates to radiative cooling technologies. Specifically, the invention relates to, e.g., a radiative cooling material that can be used for facilitating cooling of wearable electronic device, and a wearable electronic device with a radiative cooling interface made at least partly of the radiative cooling material.

BACKGROUND

During operation of a wearable electronic device, heat may be generated by internal heat source (circuits, electronics, etc. of the device) or external heat source (light, hot air, etc.). The generated heat, if not timely dissipated or otherwise removed, may accumulate in the device to affect its operation, e.g., deteriorating its performance, shortening its service life, or even causing burning in high-power high-density electronics. For skin/epidermal electronic device that is directly adhered to the skin of the user, the generated heat may be transferred to the user wearing the device, causing discomfort or even injury.

Conventional thermal management techniques for wearable electronic devices mainly rely on conduction and convection, e.g., by transferring the generated heat to the surrounding air and liquids and thermoelectric materials (external to the device or belongs to part of the device). These thermal management techniques may affect the portability of the devices and may not be sufficiently efficient, in particular for wearable electronic devices that are compact, small-sized, and packed with high power components.

SUMMARY OF THE INVENTION

In a first aspect, there is provided a radiative cooling material for facilitating cooling of a wearable electronic device. The radiative cooling material includes, or consists essentially of, a polymeric matrix and one or more materials dispersed in the polymeric matrix. The radiative cooling material is operable to facilitate reflection (e.g., scattering or backscattering) of solar radiation in at least some solar spectrum wavelengths (when the radiative cooling material is exposed to solar radiation) and to facilitate emission of thermal radiation in at least some infrared spectrum wavelengths. The radiative cooling material can be arranged to be in thermal contact with the wearable electronic device, which may become hot during operation, to facilitate its cooling, e.g., by conduction, convection, and radiation. By facilitating the reflection of the solar radiation in at least some solar spectrum wavelengths, the radiative cooling material prevents the solar radiation in at least some solar spectrum wavelengths from reaching hence heating the wearable electronic device. By facilitating the emission of thermal radiation in at least some infrared spectrum wavelengths, the radiative cooling material provides improved thermal radiation hence heat extraction and/or dissipation efficiency.

The at least some infrared spectrum wavelengths may include at least some mid-infrared spectrum wavelengths and at least some far-infrared spectrum wavelengths. The at least some infrared spectrum wavelengths may include at least some wavelengths in the region of 3 μm to 16 μm.

The at least some solar spectrum wavelengths may include at least some visible spectrum wavelengths and at least some near-infrared spectrum wavelengths. The at least some visible spectrum wavelengths may include at least some wavelengths in the region of 0.45 μm to 0.7 μm. The at least some near-infrared spectrum wavelengths may include at least some wavelengths in the region of 0.7 μm to 2.5 μm.

Optionally, the polymeric matrix is substantially transparent or translucent to the solar radiation and emissive in the at least some infrared spectrum wavelengths. The polymeric matrix may include one or more types of polymers.

Optionally, the one or more materials includes: a first material for facilitating emission of the thermal radiation in the at least some infrared spectrum wavelengths and a second material for facilitating reflection (e.g., scattering or backscattering) of the solar radiation in the at least some solar spectrum wavelengths. In some examples, the second material may not facilitate reflection of the solar radiation in at least some ultraviolet spectrum wavelengths. The at least some ultraviolet spectrum wavelengths may include at least some wavelengths in the region of 0.25 μm to 0.45 μm.

Optionally, the polymeric matrix has a first refractive index and the second material has a second refractive index larger than the first refractive index. The first refractive index may be 1.5 or less. The second refractive index may be 1.5 or above. In some examples, the second refractive index may be any value between 1.5 and 2.5.

Optionally, the polymeric matrix is made of materials with C—H and C—O bonds, and at least one of C═O and C—F bonds.

Optionally, the polymeric matrix includes at least one of: polystyrene-acrylic, polydimethylsiloxane (PDMS), poly(methyl methacrylate) (PMMA), polyvinylidene fluoride (PVDF), and polytetrafluoroethylene (PTFE). The molecular weight of the polymeric matrix may be below 20,000, between 10,000 and 20,000, between 5,000 to 20,000, etc., although other values or ranges are also contemplated. In some examples, the molecular weight of the polystyrene-acrylic may be below 20,000, between 10,000 and 20,000, between 5,000 to 20,000, etc., although other values or ranges are also contemplated.

Optionally, the polymeric matrix is selected from the group consisting of: polystyrene-acrylic, polydimethylsiloxane (PDMS), poly(methyl methacrylate) (PMMA), polyvinylidene fluoride (PVDF), and polytetrafluoroethylene (PTFE).

Optionally, the first material includes at least one of: glass (e.g., $SiO_2$), $Si_3N_4$, LiF, and SiC.

Optionally, the first material is selected from the group consisting of: glass (e.g., $SiO_2$), $Si_3N_4$, LiF, and SiC.

Optionally, the first material is in the form of particles, e.g., microparticles. Optionally, at least some of the particles of the first material are hydrophobic, e.g., have hydrophobic coatings. For example at least some of the particles of the first material may be impregnated (soaked) with a sealant, e.g., silane.

Optionally, the particles of the first material are microparticles or microspheres, e.g., with an average diameter of about 30 μm to about 60 μm, or about 40 μm to about 50 μm.

Optionally, the microparticles of the first material are hollow, with a shell and gas (e.g., air) contained in the shell.

The shell may have an average shell thickness of about 1 μm to about 5 μm, about 2 μm to about 3 μm, or about 2.5 μm. The gas may help to reduce thermal conductivity and weight of the radiative cooling material.

Optionally, the second material includes a semiconductor material, e.g., a semiconductor material with an optical bandgap of at least 2.5 eV.

Optionally, the second material may have a refractive index of 2.5.

Optionally, the semiconductor material includes a metal oxide.

Optionally, the metal oxide includes at least one of: $TiO_2$, $CaCo_3$, $BaSO_4$, ZnO, $ZrO_2$, and $Al_2O_3$.

Optionally, the metal oxide is selected from the group consisting of: $TiO_2$, $CaCo_3$, $BaSO_4$, ZnO, $ZrO_2$, and $Al_2O_3$.

Optionally, the second material is in the form of particles, e.g., nanoparticles. Optionally, at least some of the particles of the second material are hydrophobic, e.g., have hydrophobic coatings. For example at least some of the particles of the second material may be impregnated (soaked) with a sealant, e.g., silane.

Optionally, the particles of the second material have an average diameter of about 100 nm to about 400 nm, about 150 nm to about 300 nm, about 200 nm to about 250 nm, or about 220 nm to about 230 nm. Optionally, the particles of the second material have an average diameter of about 200 nm to about 800 nm, about 300 nm to about 600 nm, about 400 nm to about 500 nm, or about 440 nm to about 460 nm.

Optionally, the nanoparticles of the second material are of different sizes, and the different sizes are distributed generally following a normal (e.g., Gaussian) distribution. The distribution of sizes may help to facilitate reflection or scattering of solar radiation over a broader wavelength spectrum. The center of the normal distribution is about 100 nm to about 400 nm, about 150 nm to about 300 nm, about 200 nm to about 250 nm, or about 220 nm to about 230 nm. Optionally, the center of the normal distribution is about 200 nm to about 800 nm, about 300 nm to about 600 nm, about 400 nm to about 500 nm, or about 440 nm to about 460 nm.

Optionally, the nanoparticles of the second material are of different diameters, and the different diameters are distributed generally following a normal (e.g., Gaussian) distribution. The distribution of diameters may help to facilitate reflection or scattering of solar radiation over a broader wavelength spectrum. The center of the normal distribution is about 100 nm to about 400 nm, about 150 nm to about 300 nm, about 200 nm to about 250 nm, or about 220 nm to about 230 nm. Optionally, the center of the normal distribution is about 200 nm to about 800 nm, about 300 nm to about 600 nm, about 400 nm to about 500 nm, or about 440 nm to about 460 nm.

Optionally, the one or more materials further include a third material for facilitating conversion of the solar radiation in at least some ultraviolet spectrum wavelengths into at least some visible spectrum wavelengths.

Optionally, the third material may exhibit an excitation peak at a wavelength of less than 400 nm and an emission peak at a wavelength in the at least some solar spectrum wavelengths that the second material facilities to reflect or scatter.

Optionally, the third material includes fluorescent pigments (e.g., phosphor powders).

Optionally, the fluorescent pigments include at least one of: $SrAl_2O_4:Eu^{2+},Dy^{3+},Yb^{3+}$ and $BaMgAl_{10}O_{17}:Eu^{2+}$.

Optionally, the fluorescent pigments are selected from the group consisting of: $SrAl_2O_4:Eu^{2+},Dy^{3+},Yb^{3+}$ and $BaMgAl_{10}O_{17}:Eu^{2+}$.

Optionally, the third material is in the form of particles, e.g., microparticles. Optionally, at least some of the particles of the third material are hydrophobic, e.g., have hydrophobic coatings. For example, at least some of the particles of the third material may be impregnated (soaked) with a sealant, e.g., silane. The microparticles of the third material may have an average diameter of about 10 μm to about 40 μm, about 20 μm to about 30 μm, or about 25 μm. Optionally the microparticles of the third material may have an average diameter of about 20 μm to about 80 μm, about 40 μm to about 60 μm, or about 50 μm.

In one example, the polymeric matrix includes polystyrene-acrylic, the first material includes $SiO_2$ microparticles, the second material includes $TiO_2$ nanoparticles, and the third material includes $SrAl_2O_4:Eu^{2+},Dy^{3+},Yb^{3+}$ fluorescent pigments.

Optionally, a weight percentage of the polymeric matrix in the radiative cooling material is about 30 wt % to about 40 wt %; a weight percentage of the first material in the radiative cooling material is about 4 wt % to about 10 wt %; a weight percentage of the second material in the radiative cooling material is about 25 wt % to about 40 wt %; and a weight percentage of the third material in the radiative cooling material is about 20 wt % to about 30 wt %.

Optionally, the one or more materials are randomly and/or homogenously dispersed in the polymeric matrix.

In some embodiments, the radiative cooling material can be used for facilitating cooling of other devices (e.g., electronic devices, electrical devices, machines, etc.) and/or structures.

Optionally, the radiative cooling material further includes film forming agent(s), such as ether. The radiative cooling material may further include one or more additives, such as anti-foaming agent(s), stabilizing agent(s), suspending agent(s), coalescing agent(s), wetting agent(s), dispersant(s), leveling agent(s), etc. In one example, the anti-foaming agent(s) may include mineral oil such as polyether. In one example, the stabilizing agent(s) may include polytetrafluoroethylene (PTFE) powder for enhancing chemical resistance. In one example, the suspending agent(s) may include associative polyurethane thickener. In one example, the coalescing agent(s) may include texanol. In one example, the wetting agent(s) may include polyoxyethylene ether. In one example, the dispersant(s) may include polycarboxylate sodium salt. In one example, the leveling agent(s) may include polyurethane. In some examples, a weight percentage of each type of additives in the radiative cooling material is respectively less than 5 wt %, e.g., about 1 wt % to about 5 wt %, about 1 wt % to about 3 wt %, etc.

In a second aspect, there is provided a flexible structure for facilitating cooling of a wearable electronic device. The flexible structure is made at least partly, or entirely, of the radiative cooling material of the first aspect.

Optionally, the flexible structure is in the form of a film.

Optionally, the flexible structure has a thickness or average thickness of about 10 μm to about 10000 μm, or about 100 m to 5000 μm.

Optionally, the flexible structure is substantially planar.

Optionally, the flexible structure is stretchable or elastic.

Optionally, the flexible structure is hydrophobic. In one example the flexible structure may include a roughened surface, e.g., a surface with microstructures, which helps to provide the hydrophobicity. The surface microstructures may cause liquid (e.g., water droplets) to move spontaneously on it with different sliding speeds due to surface tension.

In a third aspect, there is provided a wearable electronic device including the radiative cooling material of the first aspect. The wearable electronic device may be a skin/epidermal electronic device, a display device, a lighting device, a sensing device (e.g., a photoplethysmography sensor, a pulse sensor), etc. The wearable electronic device may be used indoor and/or outdoor. The radiative cooling material may be made into a coating that is applied on at least part of the wearable electronic device (e.g., on one side, on multiple sides, on all sides (surrounds) of the device). The coating may, in addition to facilitate cooling, protect the part of the wearable electronic device it covers. In some embodiments, the coating may be hydrophobic to reduce or prevent moisture or liquid from contacting the electronics of the wearable electronic device. The wearable electronic device may include one or more flexible or elastic parts and the radiative cooling material may be applied to the one or more flexible or elastic parts. The wearable electronic device may be a flexible electronic device.

In one example, the wearable electronic device includes a heat source (above-ambient temperature) and the radiative cooling material is thermally coupled, directly or indirectly, to the heat source. The heat source may be, e.g., a conductive or resistance wire, an LED, or other electronic components that may heat up during operation. The wearable electronic device may further include a substrate. The heat source may be arranged between the radiative cooling material and the substrate. The substrate may be made of polyimide (PI) or polydimethylsiloxane (PDMS). The substrate may be a substantially planar. The substrate may be flexible and/or stretchable.

In a fourth aspect, there is provided a wearable electronic device including the flexible structure of the second aspect. The wearable electronic device may be a skin/epidermal electronic device, a display device, a lighting device, a sensing device (e.g., a photoplethysmography sensor, a pulse sensor), etc. The wearable electronic device may be used indoor and/or outdoor. The flexible structure may be a coating that is applied on at least part of the wearable electronic device (e.g., on one side, on multiple sides, on all sides (surrounds) of the device). The coating may, in addition to facilitate cooling, protect the part of the wearable electronic device it covers. In some embodiments, the coating may be hydrophobic to reduce or prevent moisture or liquid from contacting the electronics of the wearable electronic device. The wearable electronic device may include one or more flexible or elastic parts and the flexible structure may be applied to the one or more flexible or elastic parts. The wearable electronic device may be a flexible electronic device.

In one example, the wearable electronic device includes a heat source (above-ambient temperature) and the flexible structure is thermally coupled, directly or indirectly, to the heat source. The heat source may be, e.g., a conductive or resistance wire, an LED, or other electronic components that may heat up during operation. The wearable electronic device may further include a substrate. The heat source may be arranged between the flexible structure and the substrate. The substrate may be made of polyimide (PI) or polydimethylsiloxane (PDMS). The substrate may be a substantially planar. The substrate may be flexible and/or stretchable.

In a fifth aspect, there is provided a method for making the radiative cooling material of the first aspect. The method includes mixing an emulsion (e.g., aqueous emulsion) of a polymer matrix and one or more materials to form a mixture, and curing the mixture. The polymer matrix and/or the one or more materials are those of the first aspect. Optionally, the mixing includes stirring. Optionally, the curing includes heating or drying the mixture. Optionally, the curing includes baking, e.g., on a hot plate. As an example the baking may be performed, e.g., at 70° C. for 30 minutes. Optionally, the method includes, prior to the mixing, impregnating (soaking) the one or more materials in a sealant, e.g., silane. Optionally, the method includes, after the curing, forming microstructures on a surface of the flexible material. The forming may include roughening the surface, e.g., by polishing or grinding the surface.

In a sixth aspect, there is provided a method for making a portable electronic device. The method includes mixing an emulsion (e.g., aqueous emulsion) of a polymer matrix and one or more materials to form a mixture, applying the mixture to the portable electronic device (at least part of it), and curing the mixture. The polymer matrix and/or the one or more materials are those of the first aspect. The portable electronic device may be an existing portable electronic device.

The applying may include spin-coating or spraying the mixture onto the portable electronic device. Optionally, the mixing includes stirring. Optionally, the curing includes heating the spin-coated or sprayed mixture. Optionally, the curing includes heating or drying the spin-coated or sprayed mixture. In one example, the curing includes baking the spin-coated mixture, e.g., on a hot plate. As an example the baking may be performed at 70° C., e.g., for 30 minutes. In the spin coating operation, the spin speed can be controlled to affect the thickness of the coating.

In a seventh aspect, there is provided a radiative cooling material precursor for forming the radiative cooling material of the first aspect. The radiative cooling material precursor includes an emulsion (e.g., aqueous emulsion) of a polymer matrix and one or more materials (fillers). The polymer matrix and the one or more materials may be those in the first aspect. The radiative cooling material precursor may further include film forming agent(s) (e.g., ether). The radiative cooling material precursor may further include other additives such as anti-foaming agent(s), stabilizing agent(s), suspending agent(s), coalescing agent(s), wetting agent(s), dispersant(s), leveling agent(s), etc. In one example, the anti-foaming agent(s) may include mineral oil such as polyether. In one example, the stabilizing agent(s) may include polytetrafluoroethylene (PTFE) powder for enhancing chemical resistance. In one example, the suspending agent(s) may include associative polyurethane. In one example, the coalescing agent(s) may include texanol. In one example, the wetting agent(s) may include polyoxyethylene ether. In one example, the dispersant(s) may include polycarboxylate sodium salt. In one example, the leveling agent(s) may include polyurethane. The radiative cooling material precursor can be mixed, optionally spin-coated or sprayed, and then cured, to form the radiative cooling material of the first aspect.

In an eighth aspect, there is provided a wearable electronic device comprising a radiative cooling interface for facilitating cooling of a wearable electronic device. The radiative cooling interface is flexible, and the radiative cooling interface is made at least partly of a radiative cooling material of the first aspect. The radiative cooling interface may be integrated with the wearable electronic device (e.g., not removable). The wearable electronic device may be a skin or epidermal electronic device.

In a ninth aspect, there is provided a method for making a wearable electronic device, comprising: applying a radiative cooling material precursor on an electronic device and curing the radiative cooling material precursor to form a radiative cooling interface on the electronic device, thereby forming the wearable electronic device of the eighth aspect.

In a tenth aspect, there is provided a radiative cooling interface for facilitating cooling of a wearable electronic device. The radiative cooling interface is flexible, and the radiative cooling interface is made at least partly of the radiative cooling material of the first aspect.

Other features and aspects of the invention will become apparent by consideration of the detailed description and accompanying drawings. Any feature(s) described herein in relation to one aspect or embodiment may be combined with any other feature(s) described herein in relation to any other aspect or embodiment as appropriate and applicable.

Terms of degree such that "generally", "about", "substantially", or the like, are, depending on context, used to take into account manufacture tolerance, degradation, trend, tendency, imperfect practical conditions, etc. In some examples, these terms of degree cover the stated value plus and minus 20%, 15%, 10%, 5%, 2%, 1%, or less.

As used herein, "thermal radiation" refers to electromagnetic radiation emitted from matter at a temperature above absolute zero Kelvin. As used herein, "solar radiation" refers to electromagnetic radiation emitted by the sunlight, and "solar spectrum" refers to the distribution of such electromagnetic radiation as a function of electromagnetic wavelengths, which typically includes wavelengths from about 0.3 μm to about 3 μm (which may have different intensities).

Unless otherwise specified, terms such as "connected", "coupled", "mounted", or the like, are intended to encompass both direct and indirect connection, coupling, mounting, etc.

BRIEF DESCRIPTION OF THE DRAWINGS

Embodiments of the invention will now be described, by way of example, with reference to the accompanying drawings in which.

DETAILED DESCRIPTION

Figure 1:
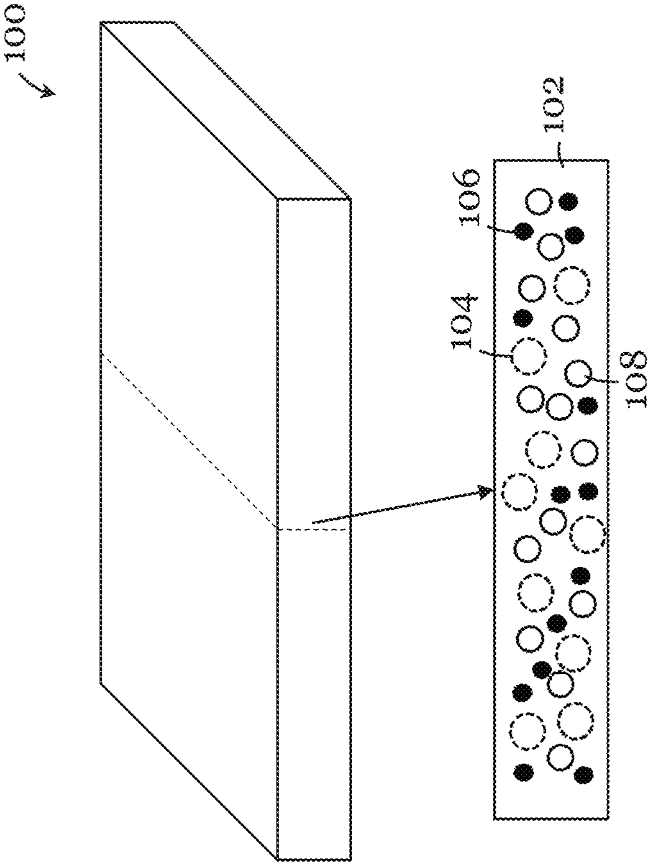
FIG. 1 is a schematic diagram of a radiative cooling material in one embodiment.

FIG. 1 shows a radiative cooling material 100 in one embodiment of the invention. The radiative cooling material 100 can be thermally coupled with a wearable electronic device to facilitate cooling of a wearable electronic device, e.g., during operation of the device. The radiative cooling material 100 can facilitate the cooling through conduction, convection, and radiation.

The radiative cooling material 100 is solar reflective and infrared emissive. That is, the radiative cooling material 100 can facilitate reflection (e.g., scattering or backscattering) of solar radiation in at least some solar spectrum wavelengths (when the radiative cooling material 100 is exposed to solar radiation) and to facilitate emission of thermal radiation in at least some infrared spectrum wavelengths. In this embodiment, the radiative cooling material 100 can facilitate emission of thermal radiation in at least some mid-infrared spectrum wavelengths and at least some far-infrared spectrum wavelengths, e.g., at least some wavelengths in the region of 3 μm to 16 μm. In this embodiment, the radiative cooling material 100 can facilitate reflection (e.g., scattering or backscattering) of solar radiation in at least some visible spectrum wavelengths (e.g., 0.45 μm to 0.7 μm) and at least some near-infrared spectrum wavelengths (e.g., 0.7 μm to 2.5 μm).

The radiative cooling material 100 includes a polymeric matrix 102 and one or more materials 104, 106, 108 dispersed, e.g., randomly and/or homogenously dispersed, in the polymeric matrix. The matrix 102 and the materials 104, 106, 108 are arranged to contribute to the solar reflective and infrared emissive properties of the material 100.

In some embodiments, the polymeric matrix 102 itself is substantially transparent or translucent to the solar radiation and emissive in the at least some infrared spectrum wavelengths. For example, the polymeric matrix 102 itself may be substantially transparent or translucent to at least some visible spectrum wavelengths (e.g., 0.45 μm to 0.7 μm) and at least some near-infrared spectrum wavelengths (e.g., 0.7 μm to 2.5 μm). For example, the polymeric matrix 102 itself may be emissive at least some mid-infrared spectrum wavelengths and at least some far-infrared spectrum wavelengths, e.g., at least some wavelengths in the region of 3 μm to 16 μm. The polymeric matrix 102 may include one or more types of polymers. The polymeric matrix 102 may be made of material(s) with C—H bond, C—O bond, and at least one of C═O bond and C—F bond. Example polymeric matrix 102 material includes polystyrene-acrylic, polydimethylsiloxane (PDMS), poly(methyl methacrylate) (PMMA), polyvinylidene fluoride (PVDF), and polytetrafluoroethylene (PTFE). In some embodiments, the molecular weight of the polymeric matrix may be below 20,000, between 10,000 and 20,000, between 5,000 to 20,000, etc. In some examples the molecular weight of the polystyrene-acrylic may be below 20,000, between 10,000 and 20,000, between 5,000 to 20,000, etc. The polymeric matrix 102 may have a refractive index of 1.5 or below.

In some embodiments, the one or more materials 104, 106, 108 include a first material 104 for facilitating emission of the thermal radiation in the at least some infrared spectrum wavelengths. The first material 104 may be arranged to complement or enhance the emissive property of the polymeric matrix 102, and it may be emissive at least some mid-infrared spectrum wavelengths and at least some far-infrared spectrum wavelengths, e.g., at least some wavelengths in the region of 3 μm to 16 μm. The enhancement of the emissive property may be due to the molecular bonds or phonon resonance. Example first material 104 includes glass (e.g., $SiO_2$), $Si_3N_4$, LiF, and SiC. The first material 104 may be in the form of particles, e.g., microparticles or microspheres, with an average diameter of about 30 μm to about 60 μm, or about 40 m to about 50 μm. In some embodiments, the particles are hollow particles each having a shell and gas (e.g., air) contained in the shell. The shell may have an average shell thickness of about 1 μm to about 5 μm, about 2 m to about 3 μm, or about 2.5 μm. The air/gas in the shell can reduce the thermal conductivity of the shell and reduce weight. In some embodiments, at least some of the particles of the first material 104 may be hydrophobic, e.g., have hydrophobic coatings, by soaking the particles in a sealant, e.g., silane.

In some embodiments, the one or more materials 104, 106, 108 further includes a second material 106 for facilitating reflection (e.g., scattering or backscattering) of the solar radiation. The second material 106 may facilitate reflection (e.g., scattering or backscattering) of solar radiation in at least some visible spectrum wavelengths (e.g., 0.45 μm to 0.7 μm) and at least some near-infrared spectrum wavelengths (e.g., 0.7 μm to 2.5 μm). In some examples, the second material 106 may not facilitate reflection of the solar radiation in at least some ultraviolet spectrum wavelengths (e.g., 0.25 μm to 0.45 μm). The second material 106 may be semiconductor material, e.g., metal oxide, preferably with an optical bandgap of at least 2.5 eV. Example semiconductor material includes $TiO_2$, $CaCo_3$, $BaSO_4$, ZnO, $ZrO_2$, and $Al_2O_3$. The second material 106 may have a refractive index larger than that of the polymeric matrix 102. Generally, the larger the refractive index of the second material 106, or the larger the difference of refractive indices between the polymeric matrix 102 and the second material 106, the better the reflection or scattering efficiency. In the above examples, $TiO_2$ has the highest refractive index, of about 2.5. For example, the second material 106 may have a refractive index of 1.5 or above, e.g., 1.5-2.5. The second material 106 may be in the form of particles, e.g., nanoparticles, which may have an average diameter of about 100 nm to about 400 nm, about 150 nm to about 300 nm, about 200 nm to about 250 nm, or about 220 nm to about 230 nm. In some other examples, the nanoparticles have an average diameter of about 200 nm to about 800 nm, about 300 nm to about 600 nm, about 400 nm to about 500 nm, or about 440 nm to about 460 nm. The nanoparticles are of different sizes or diameters, and preferably the different sizes or diameters are distributed generally following a normal (e.g., Gaussian) distribution, e.g., centered at about 100 nm to about 400 nm, about 150 nm to about 300 nm, about 200 nm to about 250 nm, or about 220 nm to about 230 nm. In some other examples, the normal (e.g., Gaussian) distribution is centered at about 200 nm to about 800 nm, about 300 nm to about 600 nm, about 400 nm to about 500 nm, or about 440 nm to about 460 nm. In some embodiments, at least some of the particles of the second material 106 may be hydrophobic, e.g., have hydrophobic coatings, by soaking the particles in a sealant, e.g., silane.

In some embodiments, the one or more materials 104, 106, 108 include a third material 108 for facilitating conversion of the solar radiation in at least some ultraviolet spectrum wavelengths into at least some visible spectrum wavelengths (e.g., 0.25 μm to 0.45 μm). In some embodiments, the third material 108 may exhibit an excitation peak at a wavelength of less than 400 nm and an emission peak at a wavelength in the at least some solar spectrum wavelengths that the second material 106 facilities to reflect or scatter (e.g., at about 500 nm). The third material 108 may be fluorescent pigments. Example fluorescent pigments include $SrAl_2O_4:Eu^{2+},Dy^{3+},Yb^{3+}$ phosphor and $BaMgAl_{10}O_{17}:Eu^{2+}$ phosphor. The third material 108 may be in the form of particles, e.g., microparticles, which may have an average diameter of about 10 μm to about 40 μm, about 20 μm to about 30 μm, or about 25 μm. In some other examples, the microparticles of the third material 108 may have an average diameter of about 20 μm to about 80 μm, about 40 μm to about 60 μm, or about 50 μm. In some embodiments, at least some of the particles of the third material 108 may be hydrophobic, e.g., have hydrophobic coatings, by soaking the particles in a sealant, e.g., silane.

In one example, the polymeric matrix 102 includes polystyrene-acrylic, the first material 104 includes hollow $SiO_2$ microparticles, the second material 106 includes $TiO_2$ nanoparticles, and the third material 108 includes $SrAl_2O_4:Eu^{2+},Dy^{3+},Yb^{3+}$ fluorescent pigments.

In some embodiments, a weight percentage of the polymeric matrix in the radiative cooling material is about 30 wt % to about 40 wt %; a weight percentage of the first material in the radiative cooling material is about 4 wt % to about 10 wt %; a weight percentage of the second material in the radiative cooling material is about 25 wt % to about 40 wt %; and a weight percentage of the third material in the radiative cooling material is about 20 wt % to about 30 wt %. The radiative cooling material 100 may include other components or additives, such as film forming agent(s) (e.g., ether), anti-foaming agent(s), stabilizing agent(s), suspending agent(s), coalescing agent(s), wetting agent(s), dispersant(s), leveling agent(s), etc., to provide the desired properties of the radiative cooling material 100. The film-forming agent may facilitate the forming of the material 100 into a structure, and may provide malleability and/or flexibility for the structure. In one example, the anti-foaming agent(s) may include mineral oil such as polyether. In one example, the stabilizing agent(s) may include polytetrafluoroethylene (PTFE) powder for enhancing chemical resistance. In one example, the suspending agent(s) may include associative polyurethane. In one example, the coalescing agent(s) may include texanol. In one example, the wetting agent(s) may include polyoxyethylene ether. In one example, the dispersant(s) may include polycarboxylate sodium salt. In one example, the leveling agent(s) may include polyurethane.

The radiative cooling material 100 has a structure. The structure may be a flexible structure, which may be elastic, stretchable, and/or bendable. In some embodiments, the flexible structure is in the form of a film, which may be substantially planar or curved. The film may have even or uneven thickness. In some embodiments, the flexible structure has a thickness or average thickness of about 10 μm to about 10000 μm, or about 100 μm to 5000 μm. The flexible structure may be hydrophobic. The hydrophobicity may be provided by the first, second, and/or third materials 104, 106, 108, which are or are made hydrophobic as described above. Additionally or alternatively, the flexible structure may include a treated, e.g., roughened, surface that has microstructures to help provide the hydrophobicity. Emery paper may be used to polish the surface of the material to endow the microstructures that enable hydrophobicity.

The radiative cooling material 100, or the flexible structure, may be included in a wearable electronic device to facilitate cooling of the wearable electronic device during operation. For example, the material 100 or the flexible structure may be attached to, coated on, mounted to, adhered to, etc., the wearable electronic device, such as one or more flexible or elastic parts of the wearable electronic device. The wearable electronic device may be a skin/epidermal electronic device, a display device, a lighting device, a sensing device (e.g., a photoplethysmography sensor, a pulse sensor), etc., which may be used indoor and/or outdoor.

Figure 2:
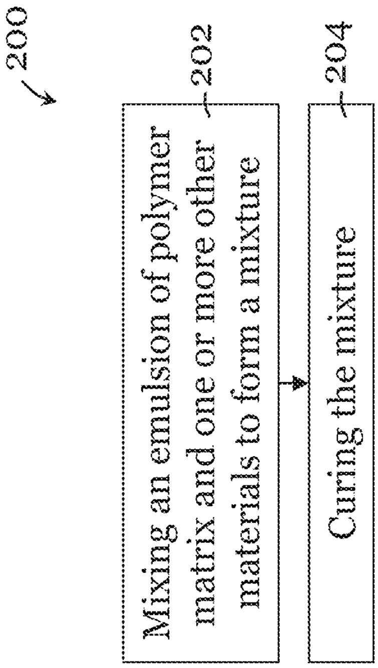
FIG. 2 is a method for making the radiative cooling material of FIG. 1 in one embodiment.

FIG. 2 shows a method 200 for making the radiative cooling material 100. The method 200 includes, in step 202, mixing an emulsion (e.g., aqueous emulsion) of the polymer matrix 102 and the materials 104, 106, 108, and optionally other components and additives (e.g., film forming agent(s)) in a container to form a mixture. The mixture corresponds to a radiative cooling material precursor. The mixing may involve stirring. Then, in step 204, curing the mixture. The curing may include heating or drying the mixture. In one example, the curing includes baking the mixture, e.g., on a hot plate. The temperature and duration of the curing may vary depending on the structure of the radiative cooling material 100 required.

In some embodiments, before the mixing in step 202, at least some of the materials 104, 106, 108 may be impregnated (soaked) in a sealant solution, e.g., silane. In some embodiments, after the curing in step 204, one or more or all surfaces of the structure of the radiative cooling material 100 may be treated, e.g., by polishing or grinding, to produce the microstructures for hydrophobicity.

To include the radiative cooling material 100 in an external device, such as a wearable electronic device, in some embodiments, the mixture obtained after step 202 may be applied onto at least part of the device. The application of the radiative cooling material 100 may be by spin-coating or spraying the mixture onto the device. For spin-coating, the spin speed can be controlled to affect the thickness of the coating or the material on the device. After the spin-coating process, the spin-coated mixture is then cured, as in step 204.

The following description describes specific, non-limiting examples of the radiative cooling material 100. In these examples, the radiative cooling material is referred to as an ultra-thin, soft, radiative cooling coating ("USRC") that can be applied to wearable (e.g., skin/epidermal) electronic device to facilitate cooling, in particular passive cooling, of the device. In these examples, the radiative cooling coating are made using, among other things, composite polymer with radiative cooling capacity. The composite polymer may be flexible, multifunctional, and/or and cost effective.

In one example, a radiative cooling coating (i.e., radiative cooling material formed as a coating) is prepared from an emulsion that is prepared through by mixing polymer matrix emulsion with functional fillers and additives. Specifically, 90 g of waterborne polystyrene-acrylic emulsion (EC-702, BASF Co. Ltd) is first added into a container (e.g., beaker). Then, about 20 g of grinding beads are added into the container for mixing and stirring at a speed of 800 revolutions per minute for 30 minutes. During stirring, functional fillers including 40 g of $TiO_2$ nanoparticles, 30 g of fluorescent pigments $SrAl_2O_4$:$Eu^{2+}$,$Dy^{3+}$,$Yb^{3+}$, and 6 g of hollow glass ($SiO_2$) microparticles, and 15 g of water are added into the container. Four additives, including 5 g of PTFE powder (as stabilizing agent), 5 g of associative polyurethane thickener (as suspending agent), 2 g of mineral oil such as polyether (as antifoaming agent) and 8 g of ether (as film-forming agent) are also added into the mixture to facilitate formation of the coating. The mixture is then stirred at a speed of 400 revolutions per minute for 20 minutes. Afterwards, the grinding beads are filtered out to obtain a resulting emulsion that forms the radiative cooling material/coating precursor. The radiative cooling material/coating precursor is then applied on a wearable electronic device (see examples below) by spin-coating, then baked on a hotplate at 70° C. for 30 minutes.

Figure 3:
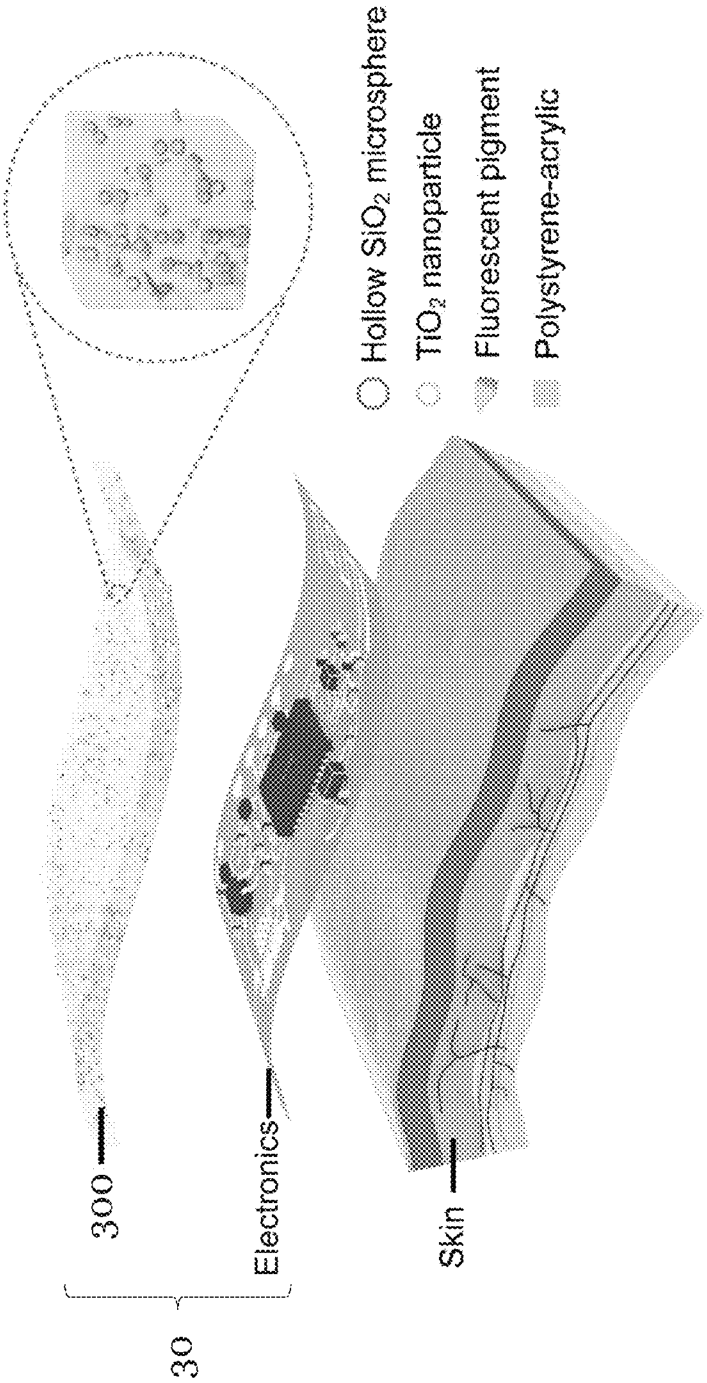
FIG. 3 is an exploded view of a wearable electronic device in one embodiment.

FIG. 3 shows a wearable electronic device 30 in one embodiment. The wearable electronic device in this example includes skin/epidermal electronics (flexible) and the radiative cooling coating 300 (prepared based on the above process) coated on the skin/epidermal electronics. The coating 300 can facilitate cooling of the device 30, e.g., during its operation. The coating 300 can be made to substantially cover the skin/epidermal electronics to protect the skin/epidermal electronics. The wearable electronic device 30 is arranged to be attached to or otherwise placed on the skin of the user (e.g., the user's wrist or hand or other body part). As shown in FIG. 3, the radiative cooling coating 300 has a substantially planar flexible structure, with a polymeric matrix formed by polystyrene-acrylic, as well as $TiO_2$ nanoparticles, fluorescent pigments $SrAl_2O_4$:$Eu^{2+}$,$Dy^{3+}$,$Yb^{3+}$, and glass ($SiO_2$) microparticles dispersed in the polymeric matrix. A skilled person understands that the structure may include other material(s) as well as impurities not specifically illustrated. The radiative cooling coating 300 can facilitate cooling of the electronics, can be bent, flexed, stretched, and be worn, can protect the electronics it covers, and/or enhance electronic performance of the device.

In some examples, the radiative cooling coating 300 is lightweight (e.g., 1.27 g/$cm^2$) and flexible, hence can be directly interfaced with the skin of a user, without causing any allergic response. In some examples, the radiative cooling coating 300 can function as a conformable sealing layer for sealing or covering the electronics in particular skin/epidermal electronics. In some examples, the radiative cooling coating 300 can not only facilitate cooling of the electronics, but also improves performance of the electronics.

Figure 4:
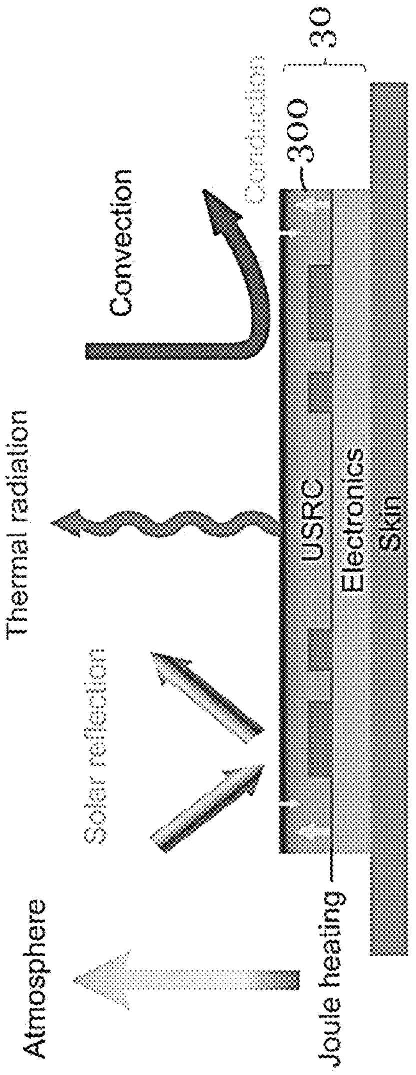
FIG. 4 is a schematic diagram illustrating the thermal exchange processes of the wearable electronic device of FIG. 3.

FIG. 4 illustrates the thermal exchange processes of the wearable electronic device 30 of FIG. 3. As shown in FIG. 4, the electronics are arranged to generate heat (above-ambient temperature, Joule heating) during operation. The generated heat may be transferred to the coating 300 through conduction and convection. The coating 300 may facilitate cooling of the electronics by thermal radiation (IR emission), solar (sunlight light) reflection, convection, conduction, etc. In other words, the coating 300 may facilitate cooling of the electronics by radiative (thermal radiation, solar reflection, etc.) and non-radiative heat transfer (convection, conduction, etc.). In some embodiments, the coating 300 enables strong thermal radiation and high solar reflectance to achieve a net heat flow away from the skin/epidermal electronics (i.e., cooling effect).

Figure 5:
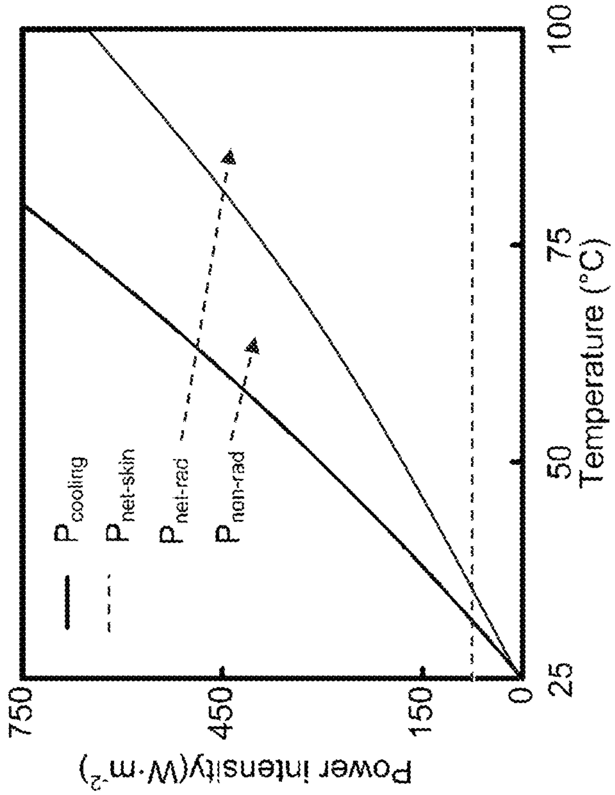
FIG. 5 is a graph showing the comparison between the cooling power intensities from the radiative and non-radiative processes for a wearable electronic device with above-ambient temperature caused by Joule heating.

FIG. 5 shows a comparison between cooling power intensities from radiative (thermal radiation, sunlight light) and non-radiative (convection, conduction) heat transfer processes for a wearable electronic device that may generate heat (e.g., by Joule heating) and be at above-ambient temperature during operation. The thermal exchange processes for the wearable electronic device consist of radiative and non-radiative heat transfer, in which the cooling power intensity can be described as follows:

$$P_{cooling} = P_{net-rad} + P_{non-rad} - P_{heat}$$

In this example, it is assumed that the device is air-tight hence no evaporative thermal process considered. The net radiative cooling power intensity and non-radiative cooling power intensity can be expressed as:

$$P_{net-rad} = \epsilon(\sigma T^4 - \epsilon_{amb}\sigma T_{amb}^4)$$

$$P_{non-rad} = h(T - T_{amb})$$

where $\epsilon$ and $\epsilon_{amb}$ are the surface emissivity of the device and effective emissivity of the ambient. $\sigma$ and h denote the Stefan-Boltzmann constant and non-radiative heat transfer coefficient, respectively. T and $T_{amb}$ are the temperature of the device surface and the ambient air. Since $\epsilon$ and $\epsilon_{amb}$ may vary significantly depending on the device and application, both the device and ambient are considered as good radiator, i.e., $\epsilon=\epsilon_{amb}=1$, in FIG. 5. Also, in FIG. 5, to directly compare the contributions from radiative and non-radiative heat transfer, the heat source is ignored (i.e., $P_{heat}=0$). The ambient temperature is set as $T_{amb}=25°$ C. The non-radiative heat transfer coefficient is chosen as h=5 W/m$^2$/K for a typical indoor environment. The radiative cooling power intensity of skin can be defined as $$P_{net-skin} = \epsilon_{skin}(\sigma T^4 - \epsilon_{amb}\sigma T_{amb}^4),$$

where $\epsilon_{skin}=0.97$ is the emissivity of human skin.

Also, as shown in the example of FIG. 5, the cooling power intensity generated from radiative heat transfer becomes larger than 75 W/m$^2$ as the temperature of the electronics surpasses the temperature of the skin on which the electronics are arranged.

Figure 6:
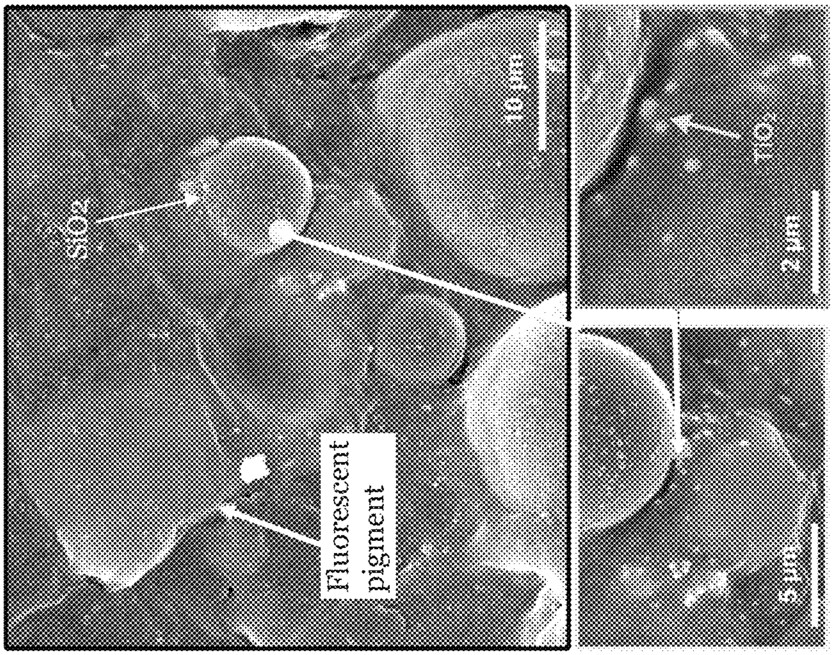
FIG. 6 is an SEM image of the cross section of an example radiative cooling coating, referred to as ultra-thin, soft, radiative cooling coating (USRC), in one embodiment.

FIG. 6 shows the SEM image of a cross section of the coating 300, which includes a polymer matrix (polystyrene-acrylic) and three types of functional fillers (hollow $SiO_2$ microspheres, $TiO_2$ nanoparticles and fluorescent pigments) dispersed in the polymer matrix. In this example, the functional fillers are homogenously mixed and randomly dispersed in the polymer matrix.

As will be described below, the coating 300 is tested and characterized. The cross-section of the coating 300 is characterized by a FEI Quanta 450 FESEM after the coating 300 breaks off from the device (after immersing into liquid nitrogen for 30 seconds). The size distributions of functional fillers are obtained by Malvern Mastersizer 3000 Particle Size Analyser. The spectral solar reflectance and the infrared emissivity of the coating 300 and a pure polymer matrix (without the fillers) are measured by a PerkinElmer Lambda 1050+ UV/VIS/NIR Wide Band Spectrometer (equipped with an integral sphere) and a Bruker Vertex-70 FITR spectrometer. The coating 300 is placed in dark box for over 8 hours to release the afterglow of fluorescent pigments before measuring the solar reflectance. The thickness of the coating 300 is measured by Bruker Dektak XT Profilometer. Tensile test is performed using Instron 5942 Micro Newton Tester.

In this example, the polymer matrix of the coating 300 provides mid-to-far infrared emission through vibrational and rotational modes of molecular bonds including C—O—C, C═C C—O and C═O, which enable absorption peaks either in or out the atmospheric window (8 μm to 13 μm). The hollow $SiO_2$ microparticles or microspheres enhance the infrared radiation/emission through phonon-polariton resonance. The inner air (core) in the hollow microparticles can help to reduce the weight of the coating 300 (so that the device can be more easily worn by the user) and decrease the thermal conductivity of the coating 300 to reduce or prevent the influence of external heat source. The rutile $TiO_2$ nanoparticles improve the solar reflectance of the coating 300 due to multiple Mie scattering. To compensate the intrinsic UV absorption of the $TiO_2$ nanoparticles, the fluorescent pigments are added to compete with the $TiO_2$ nanoparticles on UV absorption, to convert the absorbed UV light to re-emitted visible light.

Figure 7A:
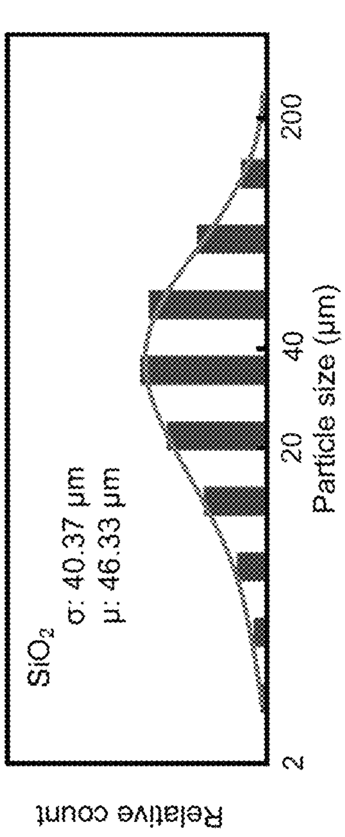
FIG. 7A is a graph showing the size distribution of $SiO_2$ microparticles in the radiative cooling coating of FIG. 6.
Figure 7B:
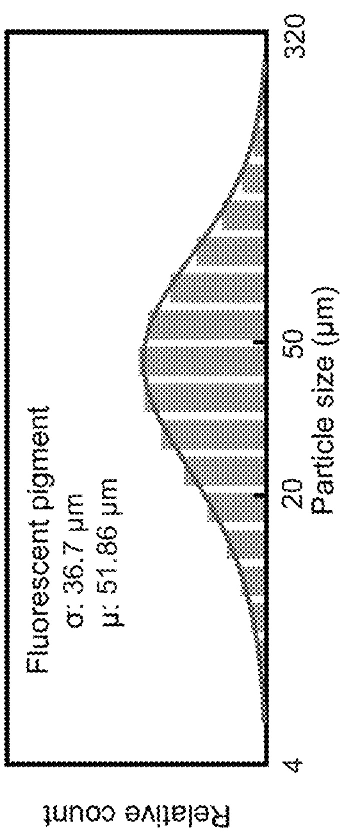
FIG. 7B is a graph showing the size distribution of the fluorescent pigments in the radiative cooling coating of FIG. 6.
Figure 7C:
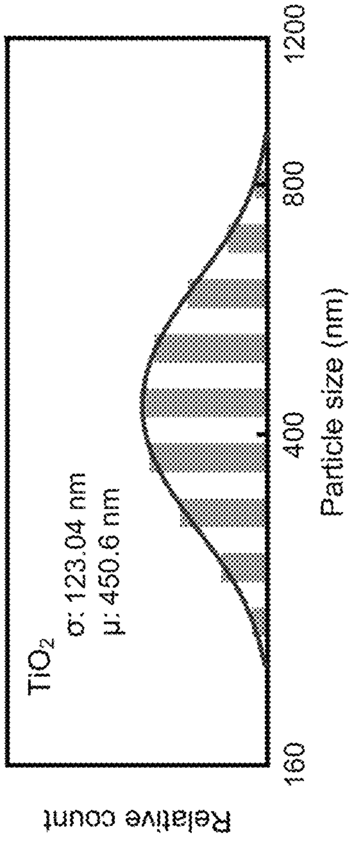
FIG. 7C is a graph showing the size distribution of $TiO_2$ nanoparticles in the radiative cooling coating of FIG. 6.

FIGS. 7A, 7B, and 7C show the size distributions of the $SiO_2$ microparticles, the fluorescent pigments, and the $TiO_2$ nanoparticles, respectively, in the coating 300. In this example, $TiO_2$ nanoparticles with a diameter around 200 nm to around 500 nm, e.g., around 200 nm to around 400 nm, provide the highest scattering efficiency for incident light with wavelengths at around 450 nm to around 750 nm (the highest intensity region of the solar radiation spectrum, see FIG. 10). In this example, as shown in FIG. 7A, the $SiO_2$ microparticles have an average size (diameter) of 46.33 μm and a standard deviation of 40.37 μm. In this example, as shown in FIG. 7B, the fluorescent pigments (particles) have an average size (diameter) of 51.86 μm and a standard deviation of 36.7 μm. In this example, as shown in FIG. 7C, the $TiO_2$ nanoparticles have an average size (diameter) of 450.6 mm and a standard deviation of 123.04 mm. The sizes (diameters) of the $TiO_2$ nanoparticles generally follow a Gaussian distribution centered at about 450 nm. In this example, this achieves efficient multiple scattering for solar radiation.

Figure 8:
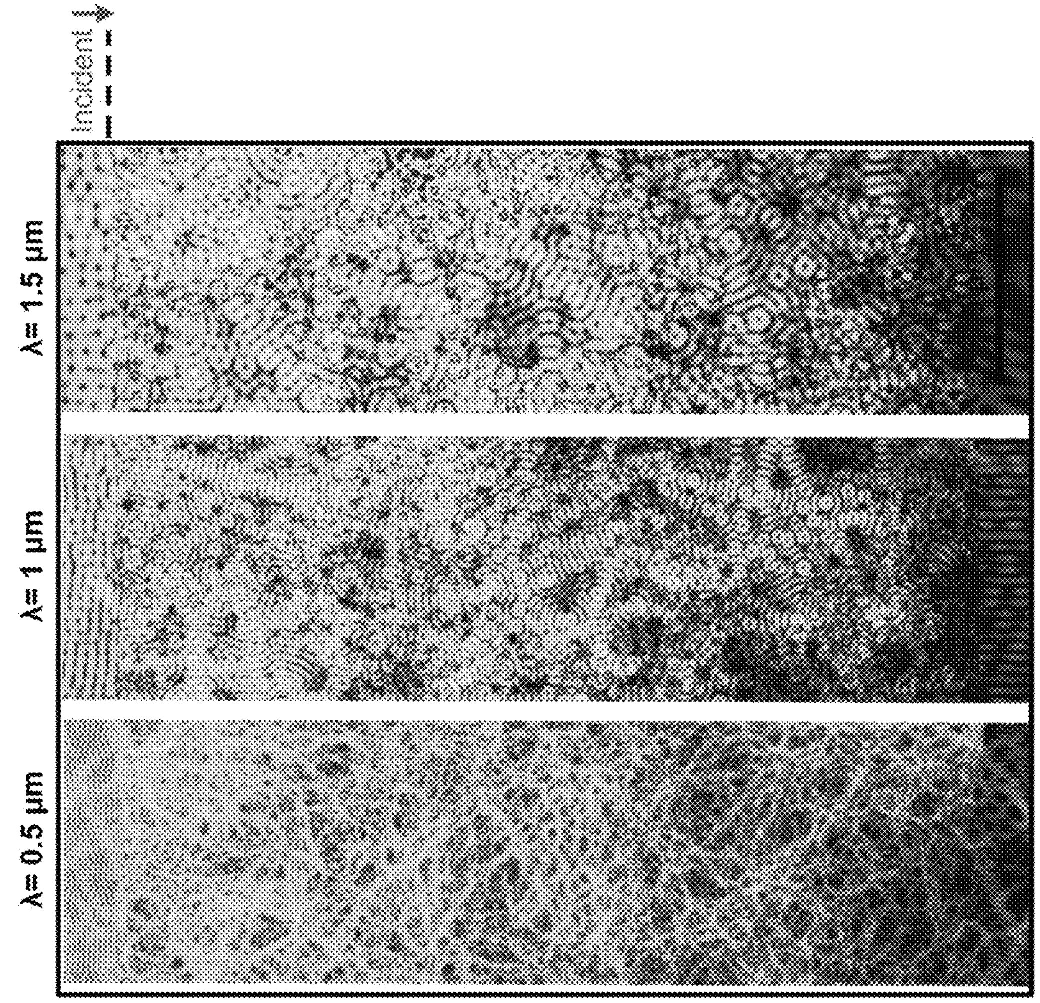
FIG. 8 illustrates the simulation results of the electric field distribution of the radiative cooling coating of FIG. 6 with the wavelengths λ of incident light at 0.5 μm, 1 am, and 1.5 μm respectively.

FIG. 8 shows simulated electric field distribution of the coating 300 with the wavelengths of incident light at 0.5 μm, 1 μm, and 1.5 μm respectively. The electric field distribution shows the propagation of incident light for different wavelengths (0.5 μm, 1 μm and 1.5 μm). It can be observed that incident light within the solar spectrum is weakened after penetrating the coating for several tens of microns (from the incident location/direction), leading to efficient backscattering.

Figure 27:
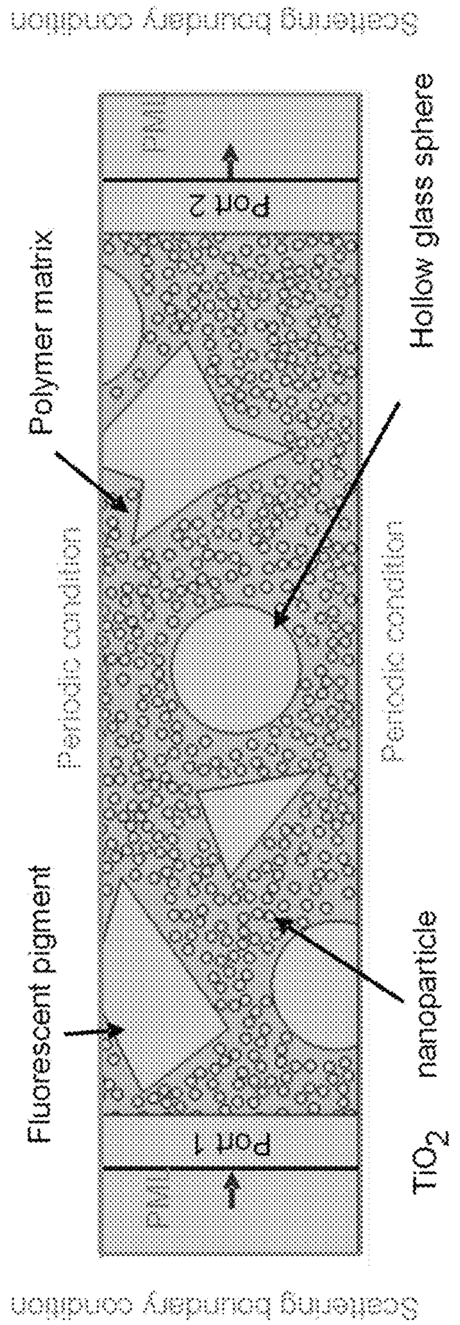
FIG. 27 is a schematic diagram illustrating a simulation model for electric field distribution in one example.

The simulated electric field distribution of FIG. 8 is generated using COMSOL to simulate the optical response of the coating 300. In one example simulation, the position and size of functional fillers are randomly generated by COMSOL LiveLink™ for MATLAB® according to their size distributions and volume fractions. In this example the simulated region is limited as 12 μm×40 μm due to the component's limitation for a single COMSOL model. The electric field distribution within the interfaces can be obtained using a periodic model consisting of the polymer matrix and functional fillers. In this example, the refractive index for polymer matrix is measured by an Ellipsometer (J. A. Woollam RC2). In this example, the refractive index for $TiO_2$ and $SiO_2$ are obtained from Mandal et al., "Paints as a Scalable and Effective Radiative Cooling Technology for Buildings". In this example, the refractive index for fluorescent pigment is taken as 1.7 (i.e., the refractive index of $SrAl_2O_4$) since minimal rare earth elements are doped. The functional fillers are randomly distributed within the matrix. Periodic boundary conditions are applied on the top and bottom sides. Two ports as well as PML boundary conditions were applied for the left and right sides. A plane wave at normal incident is applied as light source. FIG. 27 shows the simulation model for electric field distribution used for the example of FIG. 8.

Figure 9A:
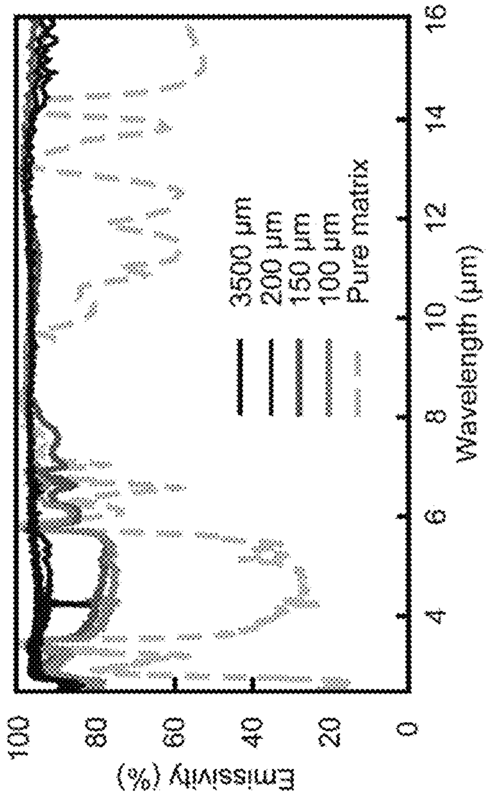
FIG. 9A is a graph showing the infrared emissivity of the radiative cooling coating of FIG. 6 with different thicknesses and that of a pure polymeric matrix.
Figure 9B:
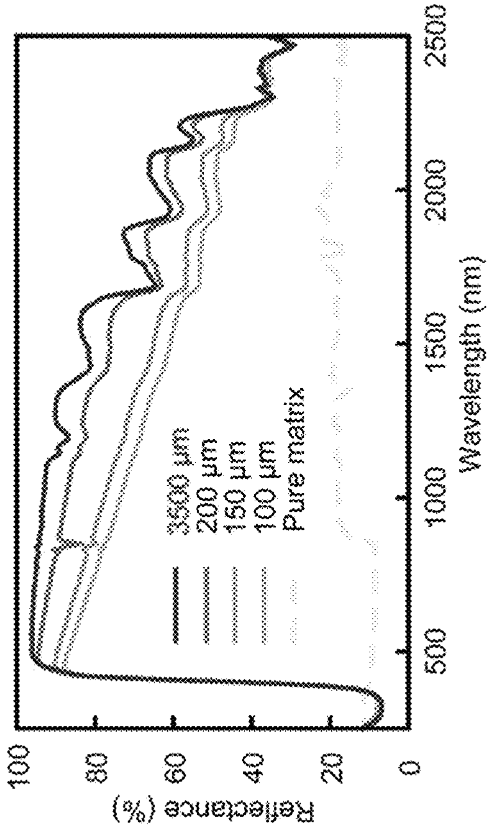
FIG. 9B is a graph showing the solar reflectance of the radiative cooling coating of FIG. 6 with different thicknesses and that of a pure polymeric matrix.

FIGS. 9A and 9B show the infrared emissivity (FIG. 9A) and solar reflectance (FIG. 9B) of the coating 300 at different thicknesses and its comparison with pure polymer matrix (without functional fillers). It can be observed that the (pure) polymer matrix is emissive in infrared and substantially transparent for sunlight light. On the other hand, the polymer matrix with the functional fillers has improved infrared emissivity and solar reflectance. In some examples, the wearable electronic device temperature is above ambient temperature due to its internal heat sources (e.g., Joule heating from the circuit), and the coating 300 performs a broadband infrared emission (to enlarge outgoing infrared radiation) rather than a selective emission for sub-ambient radiative cooling. From FIGS. 9A and 9B it can be observed that a thicker coating generally exhibits better spectral properties as it can provide more scattering interfaces and more emissive substances. In some examples, the overall infrared emittance for the coating 300 can achieve 97% at a thickness of 200 m and a thicker coating 300 is required for high solar reflectance (88% at thickness of 3500 μm). It should be noted that the solar reflectance spectra shown are without the fluorescent contribution as commercial UV/VIS/NIR spectrometers cannot distinguish the reflected light at incident wavelength from fluorescence emission at another wavelength. In one example, by considering fluorescent contribution, the effective solar reflectance of a 3500 μm thick coating 300 reaches over 91%.

Figure 10:
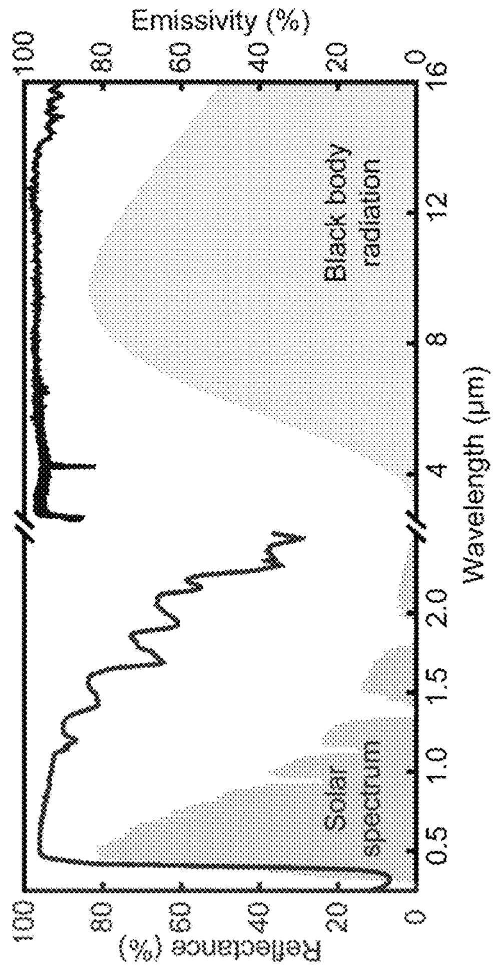
FIG. 10 is a graph showing the reflectivity and emissivity spectra of the radiative cooling coating of FIG. 6 from visible to far-infrared wavelength range.

FIG. 10 shows the reflectivity and emissivity spectra of the coating 300 from the visible to far-infrared wavelength range. It can be seen that the solar reflectance of the coating 300 is highest at the higher intensity portion of the solar spectrum and the solar reflectance decreases as the solar spectrum wavelength increases and solar spectrum intensity decreases.

The radiative cooling capacity of the coating on dissipating Joule heat produced by conductive interconnects in skin electronics is investigated, using metallic traces as resistance wire since the Joule heat from resistance wire contribute to temperature increase in electronics relatively significantly.

FIGS. 11 to 14C illustrate an example wearable electronic device 30' including the radiative cooling coating 300' in one embodiment.

The device 30' is made by the following process. First, a layer of photoresist (AZ 5214, AZ Electronic Materials) is spin coated on a copper (Cu) (18 μm)/polyimide (30 μm) foil. Then, the assembly is soft baked at 115° C. for 5 minutes. The assembly is then exposed to UV for 10 seconds with a mask of the pattern of the wire, the photoresist is developed in AZ 400K solution for 90 seconds and subsequently baked at 115° C. for 5 minutes. Afterwards, the Cu layer is wet-etched by aqueous solution of $FeCl_3$ for 2 minutes to remove the unwanted Cu, then rinsed with deionized (DI) water and baked at 115° C. for 5 minutes sequentially. Next, the pattern is rinsed using acetone for 1 minute to remove unwanted photoresist. Then, enameled wire is used for soldering. After soldering with enameled wire and plasma treatment (energy 10 kJ; Harrick plasma cleaner PDC-002), a radiative cooling material/coating precursor (such as that described above) is spin-coated onto the assembly at predetermined rotation (spin) speed. Finally, the flexible heating wire coated with the radiative cooling material/coating precursor is baked at 70° C. for 30 minutes.

Figure 11:
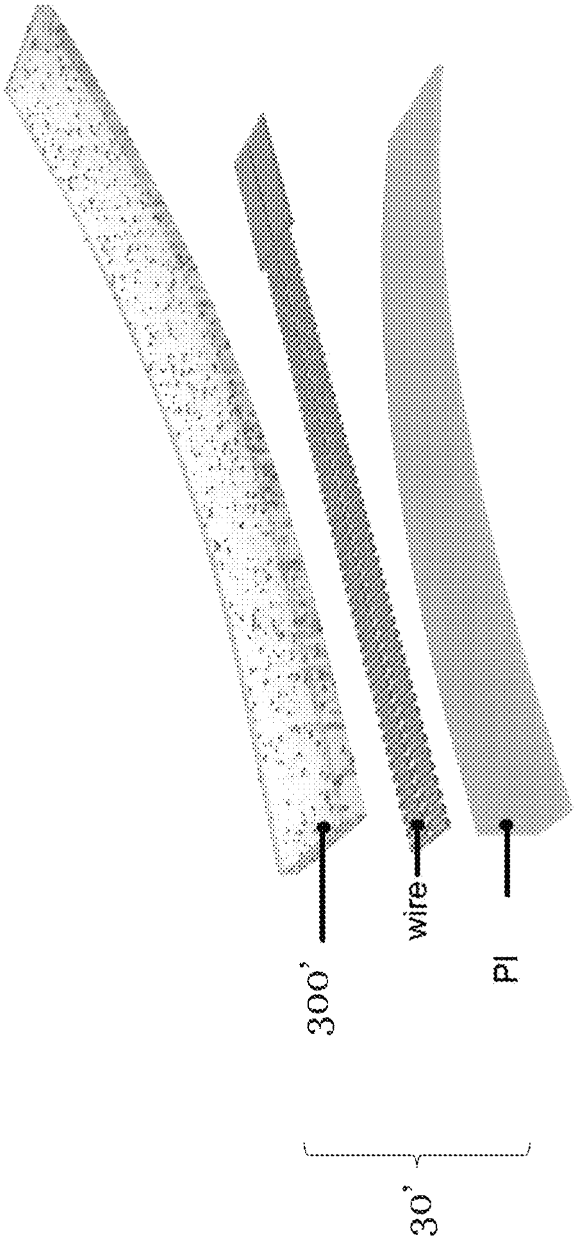
FIG. 11 is an exploded view of a wearable electronic device in one embodiment.

The wearable electronic device 30' fabricated based on this process is shown in FIG. 11. The wearable electronic device 30' includes a bottom substrate made of polyimide (PI), a top radiative cooling coating 300', and a flexible resistance wire, with a meandering pattern, arranged (e.g., sandwiched) between the substrate and the coating 300'. The flexible resistance wire (area: $S_o$=100 $mm^2$) is arranged to heat up, e.g., by Joule heating, when a current passes in the wire. The wearable electronic device 30' is thin and soft. The wire and the coating 300' are coupled in such a way that wearable electronic device 30' can be bent, twisted, folded, etc., without being damaged. In this example, the coating 300' integrated flexible resistance wires exhibit great flexibility due to the intrinsically soft nature of the coating 300' and the mechanical construction of the resistance wire. In some embodiments, plasma treatment may improve the Van der Waals bonding strength between the flexible resistance wire and the coating 300' under bending, twisting, folding, etc.

To investigate the cooling effect of the coating 300' on the device 30' (the wire as the primary heat source), the device 30' is mounted on a support bracket, e.g., using adhesives (double-sided tape). To reduce thermal conduction between the wire and the support bracket, the part of the device 30' that heats up is suspended such that it does not contact the surface of the supporting bracket. The two poles of the heating wire are connected to a DC power supply using enameled wire. The temperature of the bottom (PI layer) of the device 30' is measured by an infrared camera (Fluke connect FLK-TIS60, Fluke), when the device operates at different currents (from 0.1 A to 0.5 A). The distance between the infrared camera and the device 30' is 30 cm. In this example, the temperature measurement method for device 30' is based on infrared measurement using an RF analysis instrument; temperature variation of the device 30' is measured indoor; and the temperature measurement is conducted in an enclosed environment to reduce interruption of thermal convection.

Figure 12A:
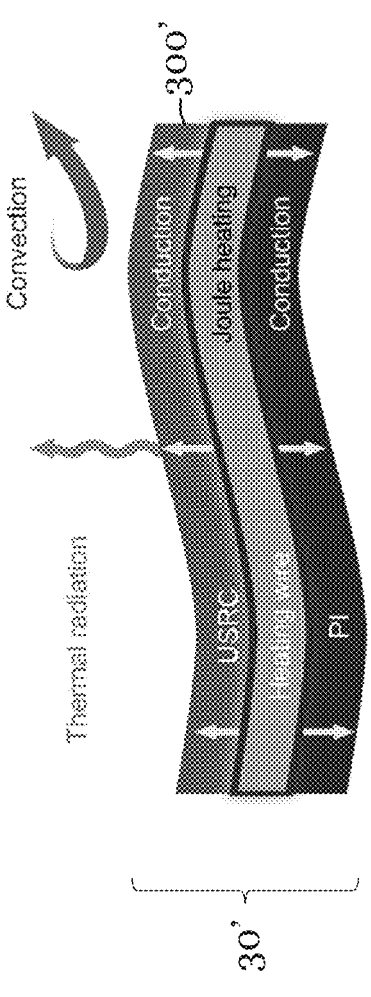
FIG. 12A is a schematic diagram illustrating the thermal exchange processes of the wearable electronic device of FIG. 11.

FIG. 12A illustrates the thermal exchange processes of the wearable electronic device 30'. As shown in FIG. 12A, Joule heat generated from the wire flows to the coating 300' and dissipates to the ambient environment through air convection and thermal radiation. Though thermal conduction also occurs towards the PI polymer substrate and the underlying skin (when the device is attached on the skin of a user), the open space external to (e.g., above) the coating 300' provides a cooler radiative heat sink and an additional thermal exchange channel (i.e., convection), which is more efficient and favorable for heat dissipation. Therefore, the adoption of the coating 300' can effectively reduce heat flow towards the underlying skin to improve thermal comfort and reduce the risk of skin burns.

A control group of devices with bare resistance wire on polymer substrate (i.e., without the coating 300') are prepared and are tested for comparison. In this control devices, cooling by convection remains while thermal radiation is significantly reduced due to the low emissivity of metal.

To reveal the cooling effect of the coating 300' in the device 30', the temperature variations of the flexible heating wires are measured for both the control devices and the device 30' coated with the coating 300' under different thicknesses (H=75 μm to 600 μm, at fixed coating area: S=1.5 $S_o$) and coating areas (S=1 $S_o$ to 2.5 $S_o$ at fixed coating thickness: H=150 μm) of the coating 300'. In this example, the temperature measured is the temperature of the PI substrate, which corresponds to an accurate temperature of the device, to avoid unexpected influence of variables such as emissivity difference induced by the interfaces thickness variations. It is known that heat generated by electronics is associated with the input power. In this example, the influence of input current to the flexible resistance wire ranges from 0.1 A to 0.5 A, and the temperatures of the flexible resistance wires become relatively stable after around 5 minutes (from the time the current is introduced), reaching the thermal equilibrium state. Therefore, all temperature measurements are taken after 5 minutes after reaching the thermal equilibrium state.

Figure 12B:
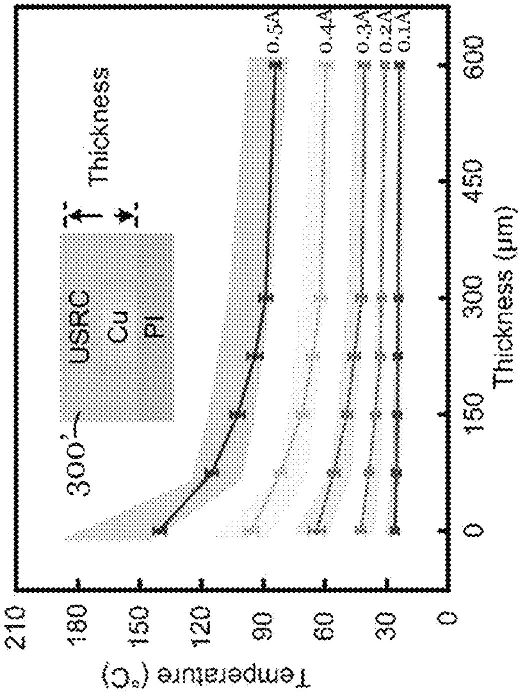
FIG. 12B is a graph showing the temperature variation of the wearable electronic device for different coating thicknesses of the radiative cooling coating in one embodiment and at different operation currents (the shaded region depicts simulation results)
Figure 12C:
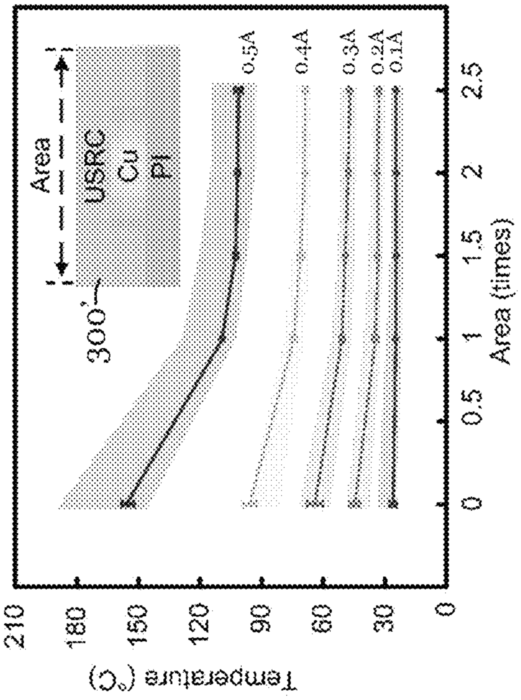
FIG. 12C is a graph showing the temperature variation of the wearable electronic device for different coating areas of the radiative cooling coating in one embodiment and at different operation currents (the shaded region depicts simulation results)

FIGS. 12B and 12C show the temperature variation of the wearable electronic device 30' for different coating 300' thicknesses and areas, under different operation currents. As shown in FIGS. 12B and 12C, when the flexible wire operates at a lower input current (0.1 A), there is no obvious temperature difference between the device 30' and the control devices (i.e., H=0) due to the negligible Joule heating generation. As the input current increases, the temperature variation becomes more significant, and the device 30' with coating shows a much lower temperature (compared to the control devices). These results are consistent with computational simulation results (the shaded regions). For a fixed coating area, a thicker coating 300' generally provides better overall emissivity hence better cooling effect. For some coating thicknesses, the heat of the conductive resistance wires wrapped in the coating 300' spreads horizontally.

The computational simulation results in FIGS. 12B and 12C in this example are obtained using COMSOL (to simulate the temperature distribution for resistance wire). In this simulation example, the entity of heating wire is imported from its CAD file. A bottom layer PI, a top layer radiative cooling coating, and two pieces of tape attached on the bottom of PI are then generated. The boundary conditions for all the outer surfaces in the model are heat fluxes including surface radiation based on the emissivity and air convection based on a non-radiative heat transfer coefficient h. As seen in FIGS. 12B and 12C, the simulation results matched well with the experiments at the non-radiative heat transfer coefficient of h=15~25 $W/m^2/K$.

Figure 13:
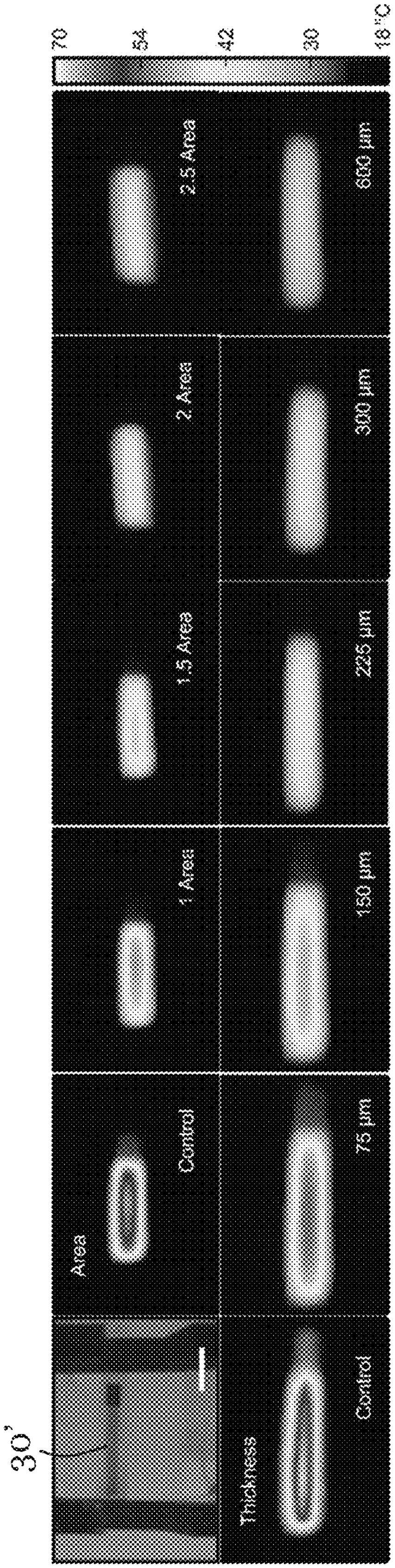
FIG. 13 shows an image of the wearable electronic device and corresponding infrared images at different coating thicknesses and coating areas of the radiative cooling coating under an operation current of 0.3 A.

FIG. 13 shows the infrared images of the device 30' at different coating 300' thicknesses and areas (the device 30' is operating at a current of 0.3 A). It can be observed that generally a larger coating area and/or a larger thickness would result in better cooling effect and the heated region slightly expands with the increased coating area and the cooling effect may remain the same even under deformation. In this example, the relatively low thermal conductance of the coating 300' may limit the expansion of highly emissive area and potentially affect the cooling effect, but it may reduce the resistance variation at high input power and improve device performance at the presence of external heat source.

Figure 14A:
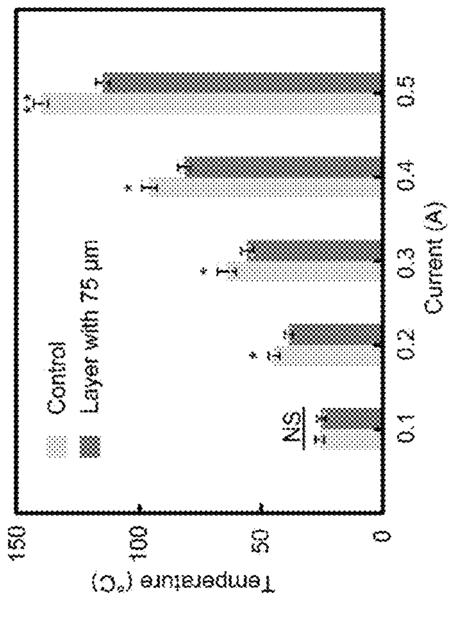
FIG. 14A is a graph showing statistical analysis of the cooling effect of the radiative cooling coating in the wearable electronic device at different operation currents (0.1 A, 0.2 A, 0.3 A, 0.4 A, 0.5 A)
Figure 14B:
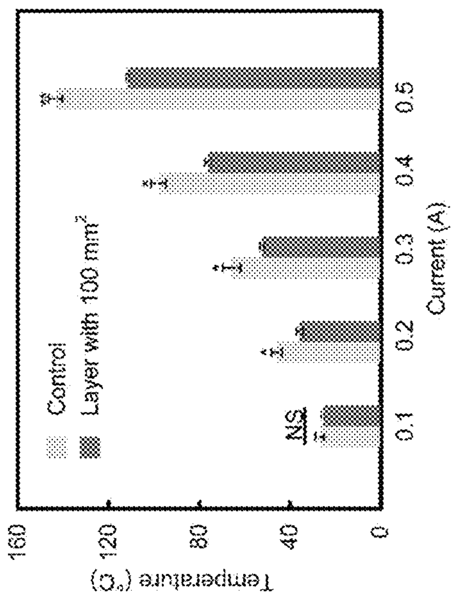
FIG. 14B is a graph showing statistical analysis of the cooling effect of the radiative cooling coating in the wearable electronic device at different operation currents (0.1 A, 0.2 A, 0.3 A, 0.4 A, 0.5 A)

FIGS. 14A and 14B show further statistical comparison of the cooling effect between the device 30' (thickness 75 μm, area 100 $mm^2$) and the control device, when the wire operates at different currents from 0.1 A to 0.5 A. Both of the thickness of the coating 300' and the area of the coating 300' present significant differences between the device 30' and the control device (P=0.012847 for coating thickness, P=0.020245 for coating area, n=3). For a coating thickness of H=75 μm, the temperatures of the device 30' with a coating area of S=2.5 $S_o$ (32.9° C., 47.2° C., 68.73° C., 101.3° C.) are lower than the control device (44.6° C., 64.1° C., 95.9° C., 140.5° C.) at a current ranging from 0.2 A to 0.5 A. On the other hand, for a coating area at S=$S_o$, the temperatures of the device 30' further lowered to 0.2 A@30.9° C., 0.3 A@40.8° C., 0.4 A@59.8° C. and 0.5 A@84.2° C., with H=600 μm. In some applications, the design of skin/epidermal electronics should take into account thermal comfort to the user so it may be necessary to limit the device operation temperature to a certain amount (e.g., to below 44° C.) to avoid causing thermal discomfort or skin burns.

Figure 14C:
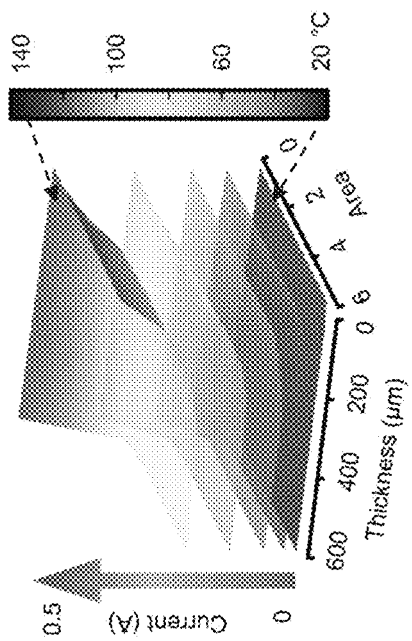
FIG. 14C is a graph showing temperature distribution of the wearable electronic device with different thicknesses, coating areas, and currents.

FIG. 14C shows the temperature distribution of the device 30' with different coating 300' thicknesses, coating 300' areas, and currents to the wire. In one example, the coating 300' can cool the temperature of the resistance wire from 64.1° C. for the control device to 42.12° C. at an input current of 0.3 A with the coating thickness being only 150 μm. This example illustrates that the coating 300' can be used for thermal management in wearable electronics.

FIG. 15 to 21 illustrate an example wearable electronic device 30" including the radiative cooling coating 300" in one embodiment. The wearable electronic device 30" is a stretchable/deformable (flexible) skin/epidermal lighting device.

The device 30" is made by the following process. First, a layer of PDMS (PDMS: curing agent, 15:1) is spin-coated (600 rpm, 30 seconds) on a quartz glass slide (75*75 $mm^2$) then baked at 70° C. for 5 minutes. Afterwards, a copper (Cu) (18 μm)/polyimide (30 μm) foil is placed on the layer of PDMS and then patterned by laser cutting (ProtoLaser U4; LPKF Laser & Electronics) to form a copper serpentine coil (35×35 mm, coil width: 180 μm). Afterwards, the LED (emission wavelength: 488 nm) and capacitor (70 pf) are soldered at the soldered dot. The enameled wire is thermally bonded with soldering paste at the connection port. Next, the top surface of the LED is tightly attached with a tape (Magic™ tape, 3M) as shielding. The area of shielding tape is laser-cut into the shape of the LED. After plasma treatment of foil, the radiative cooling material/coating precursor (such as that described above) is sequentially spin-coated onto the coil at 200 rpm then the shielding tape is removed, after which the assembly is baked at 70° C. for 30 minutes. Next, the fabricated coil integrated with the radiative cooling coating is patterned by laser cutting to remove unwanted coating layer. After laser cutting, a water-soluble tape is used to pick up the wireless stretchable electronic-skin lighting system. $Ti/SiO_2$ is deposited on the bottom side of the water-soluble tape by electronic-beam to form an adhesive layer for strong bonding effect. Afterwards, the water-soluble tape is treated by UV Ozone cleaner for 1 min together with another thin PDMS layer (PDMS: curing agent, 15:1, thickness: 75 μm) to form a chemical combination between $SiO_2$ layer and PDMS when the water-soluble tape and the fabricated device are mounted onto the PDMS. Finally, the transferred pattern is immersed in water for removing the water-soluble tape, and the assembly is then baked at 70° C. for 30 minutes.

Figure 15:
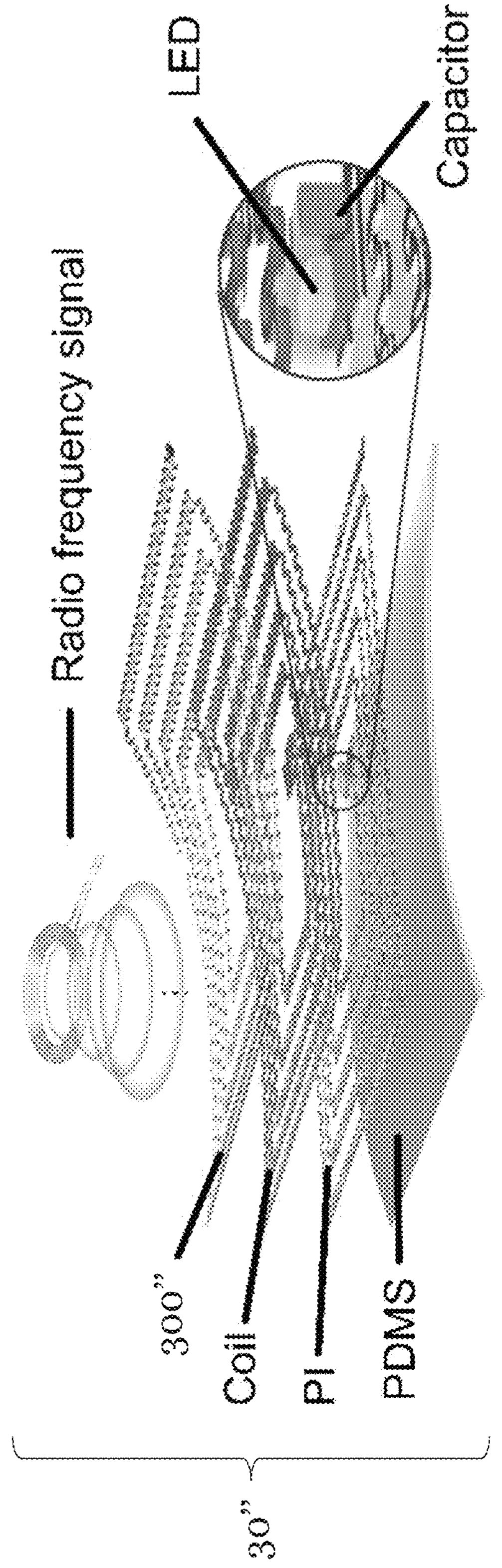
FIG. 15 is an exploded view of a wearable electronic device in one embodiment.

As shown in FIG. 15, the device 30", i.e., the lighting system, includes a bottom PDMS sealing layer, a polyimide (PI) supporting layer arranged on the bottom PDMS sealing layer, a serpentine coil with multiple turns arranged on the polyimide (PI) supporting layer and operable as RF antenna for wireless power transmission, a light-emitting diode (LED, with a capacitor) coupled to the coil, and a top radiative cooling coating 300" arranged adjacent the LED/capacitor and covering some of the coils. In this example, the patterned coating (thickness H=225 um) is applied as a layer covered on the device 30" for encapsulation and thermal management.

Figure 16:
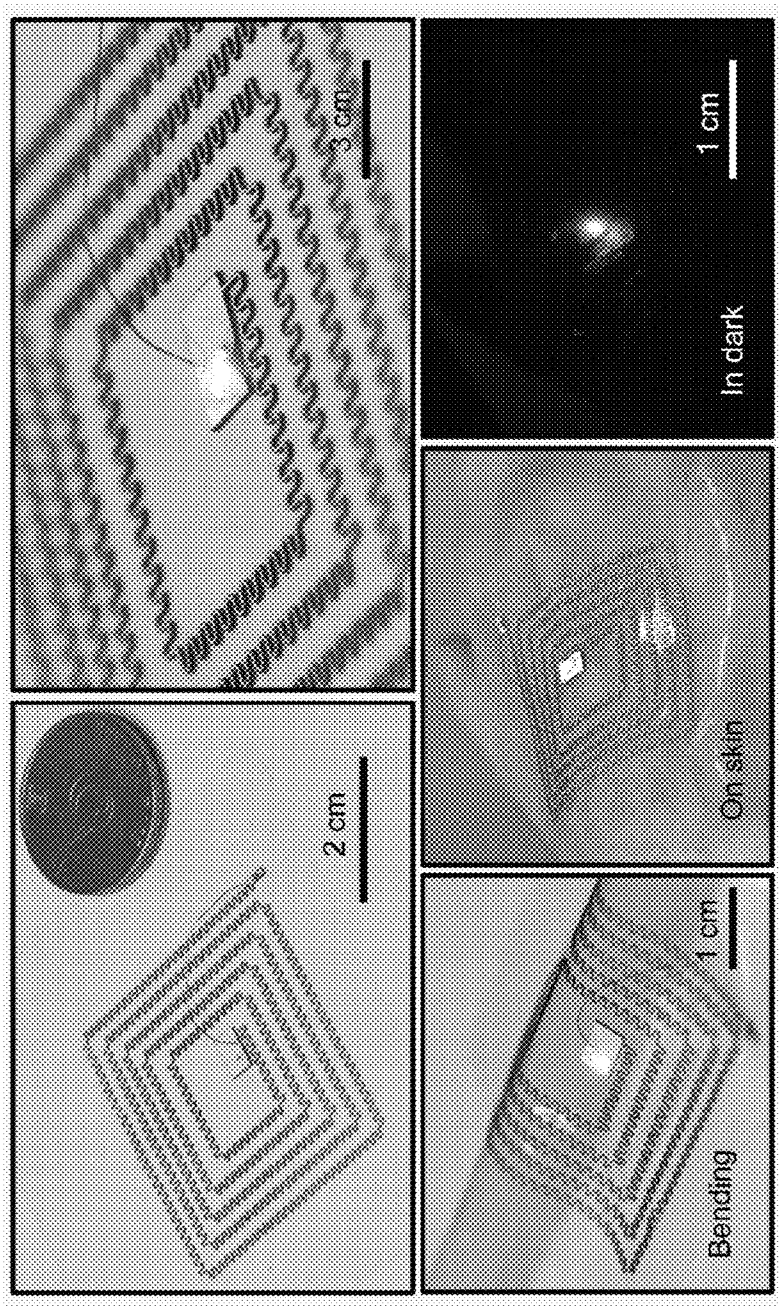
FIG. 16 show images of the wearable electronic device of FIG. 15.

FIG. 16 shows the images of as-fabricated device 30" as a radiative cooling coating coated wireless electronic device. The device 30" is flexible and can operate stably when it is bent, stretched, placed on skin, integrated with skin, in the dark, etc.

Figure 17:
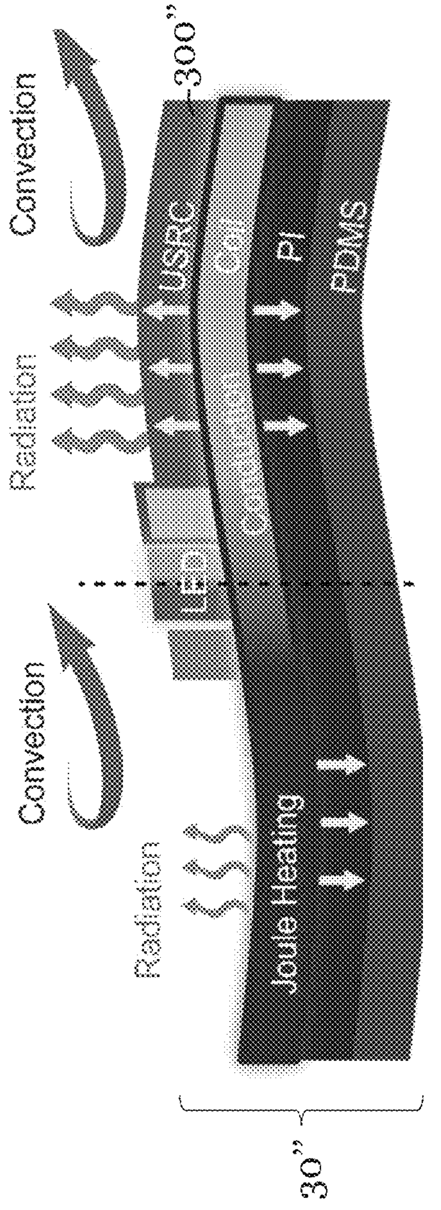
FIG. 17 is a schematic diagram illustrating the thermal exchange processes of the wearable electronic device of FIG. 15.

FIG. 17 illustrates the thermal exchange processes of the wearable electronic device 30". Similar to the thermal exchange processes in FIG. 12A for the device 30', the coating 300" facilitates heat dissipation (compared to the bare coil) and can enable efficient cooling of the device 30".

To evaluate the thermal management capacity of the coating 300" on the device 30", temperature variation of the PDMS substrate of the device 30" is recorded for the device 30" operating at an input power ranging from 20 mW to 160 mW for 15 minutes, when thermal equilibrium is reached. In this example, the temperature measurement method for device 30" is based on infrared measurement using an RF analysis instrument; the temperature variation of the device 30" is measured indoor; and the temperature measurement is conducted in an enclosed environment to reduce interruption of thermal convection.

To evaluate the cooling effect of the coating 300" on the device 30", the device 30" is mounted on a support bracket. To reduce thermal conduction between the device 30" and the support bracket, the operation (heated) area of the device 30" is arranged to be in direct contact with the environment (air). The power supply for the device 30" is based on wireless radio frequency technology (RF). Briefly, the RF signal is generated by a waveform generator with a radio frequency of 13.56 MHz based on impedance analysis results of lighting system and then amplified by a power amplifier, a RF coil (diameter 35 mm, number of turns: 5) is applied as RF antenna for power transmission to power the device 30". The transmitter RF coil is placed in front of the device 30" at a center-to-center distance of 2 cm. The temperature in the backside (PDMS layer) is measured by an infrared camera. The distance between the infrared camera and the device 30" is 30 cm.

Figure 18A:
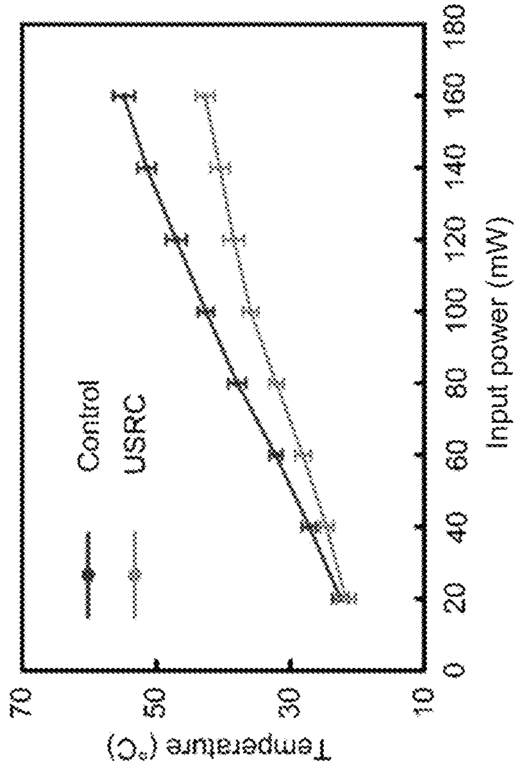
FIG. 18A is a graph showing the temperature variation of the wearable electronic device (and a control device) at different input powers (thickness of the radiative cooling coating is 225 μm)

FIG. 18A shows the temperature variation of the device 30", and a control device (without the coating 300"), at different input power (thickness of the radiative cooling coating is 225 μm). As shown in FIG. 18A, the measured temperature of the device 30" is lower than control device at all input powers. The cooling effect is increased by increasing the input power (consistent with the results for the device 30').

Figure 18B:
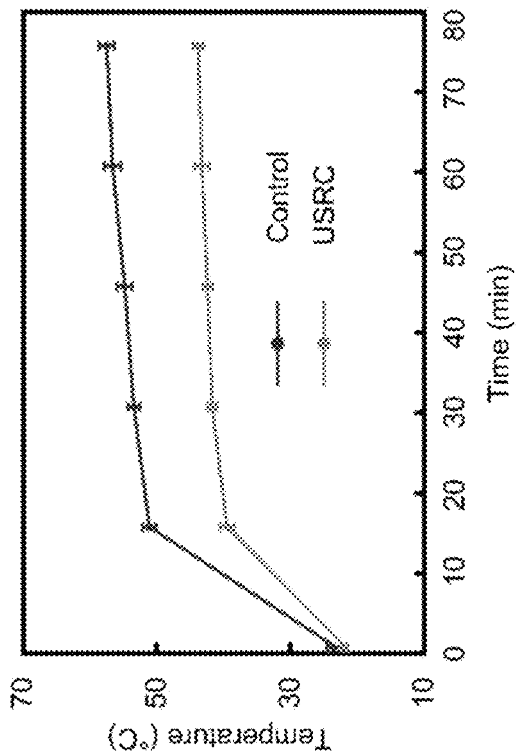
FIG. 18B is a graph showing the temperature variation of the wearable electronic device (and a control device) over time.

FIG. 18B shows the temperature variation of the device 30", and a control device (without the coating 300"), over time during operation (input power of 160 mW). It can be observed that the temperature of the device 30" reaches thermal equilibrium within 20 minutes while the temperature of the control device continues to rise after 20 minutes.

Figure 19A:
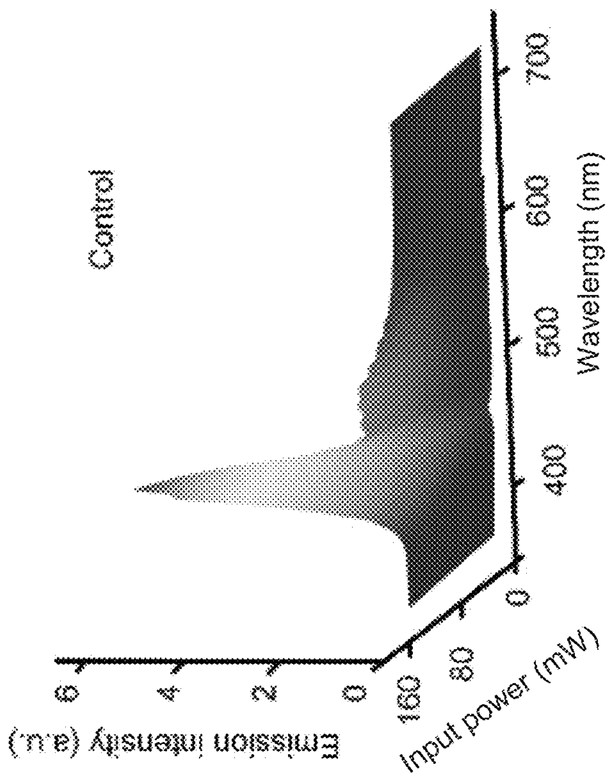
FIG. 19A is a graph showing the emission distribution of fluorescent light generated from a wearable electronic (control) device without the radiative cooling coating.
Figure 19B:
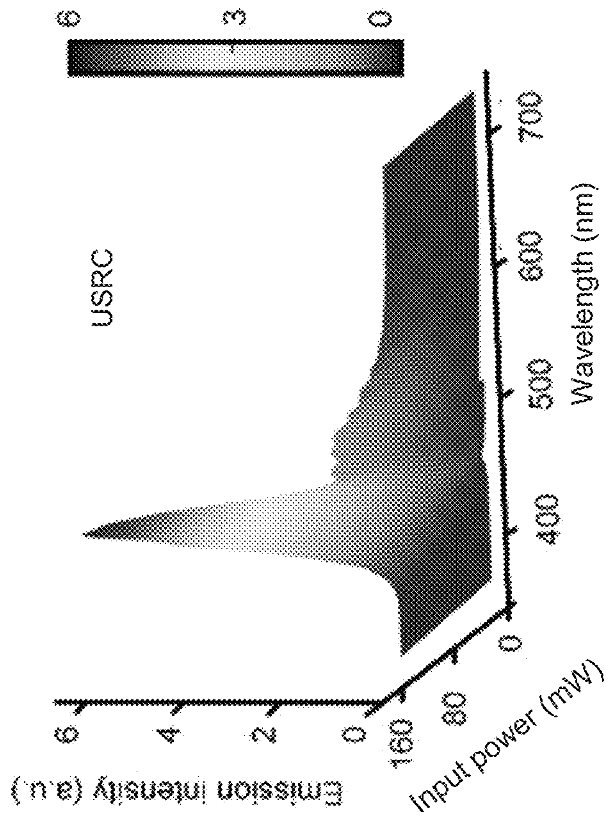
FIG. 19B is a graph showing the emission distribution of fluorescent light generated from the wearable electronic device with the radiative cooling coating in one embodiment.

In this example, the coating 300" does not only facilitate cooling, but also improves operation performance of the device 30". FIGS. 19A and 19B show the emission distribution of fluorescent light generated from the device 30" and the control device (without coating 300"). The spectral emission intensities of the device 30" and the control device are measured when the respective device is operating at different input powers (from 20 mW to 160 mW). The light intensities from the LEDs in the device 30" and the control device is measured through a customized upright microscope system (Olympus, BX51). The LEDs for both the device 30" and the control device are fixed at the same height under the microscope. No objective lens is used as the focused light may exceed the measurement range of the sensor. The light is directed by the microscope to a spectrometer (Princeton Instruments, SP2300i) coupled with a TE-cooled CCD (PIXIS: 400BR_eXcelon) for spectrum analysis. As shown in the FIGS. 19A and 19B, a significant improvement of illumination intensity, with a more restrained envelope, can be observed for the device 30".

Figure 20A:
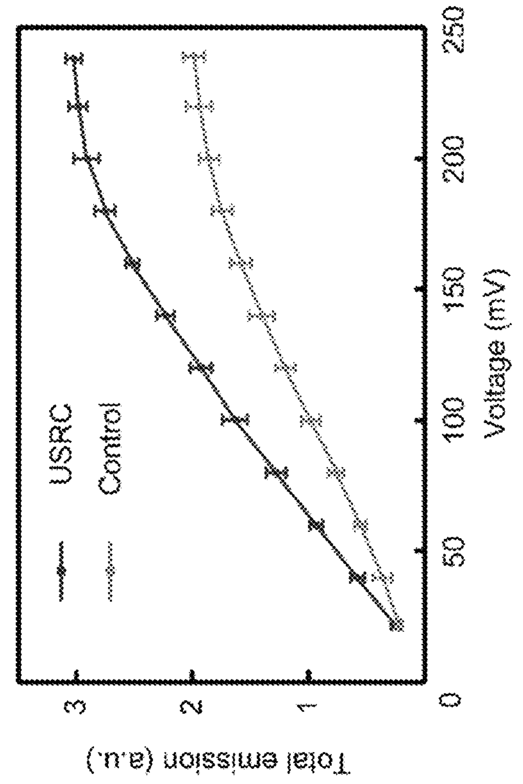
FIG. 20A is a graph showing the total emission of fluorescent light generated from the wearable electronic device without the radiative cooling coating (control) and with the radiative cooling coating in one embodiment.
Figure 20B:
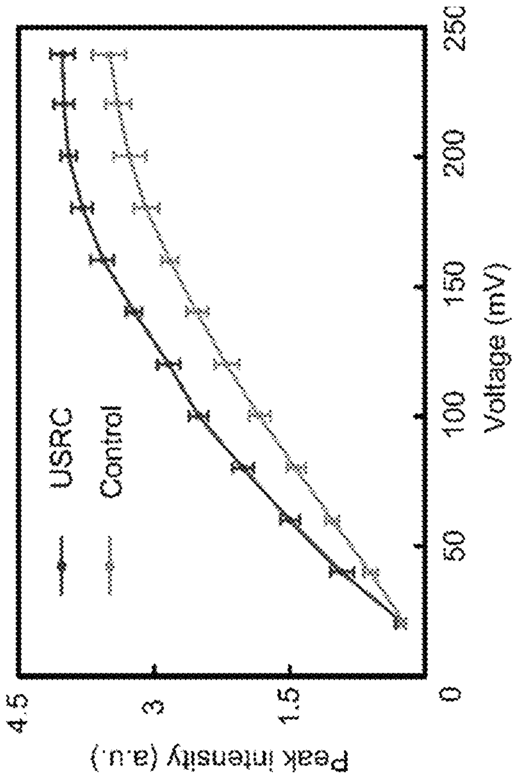
FIG. 20B is a graph showing the peak intensity of fluorescent light generated from the wearable electronic device without the radiative cooling coating (control) and with the radiative cooling coating in one embodiment.

FIGS. 20A and 20B show the total emission and the peak intensity of fluorescent light generated from the device 30" and the control device. The total emission (integrated from 350 nm to 720 nm) and the peak intensity (at 462.7 nm) of the device 30" noticeable improvement of 15.6% and 27.3%, respectively, compared with the control device at an input power of 240 mW. Thus, the coating 300" enables a higher illumination intensity of LED as well as a higher energy conversion efficiency for the device 30" (compared with control device at the input power of 160 mW). The decreased device temperature reduces resistance of the circuit thereby releasing more energy from Joule heating to lighting. The coating 300" can provide not only considerable cooling effect but also improve power efficiency for the device 30".

Figure 21:
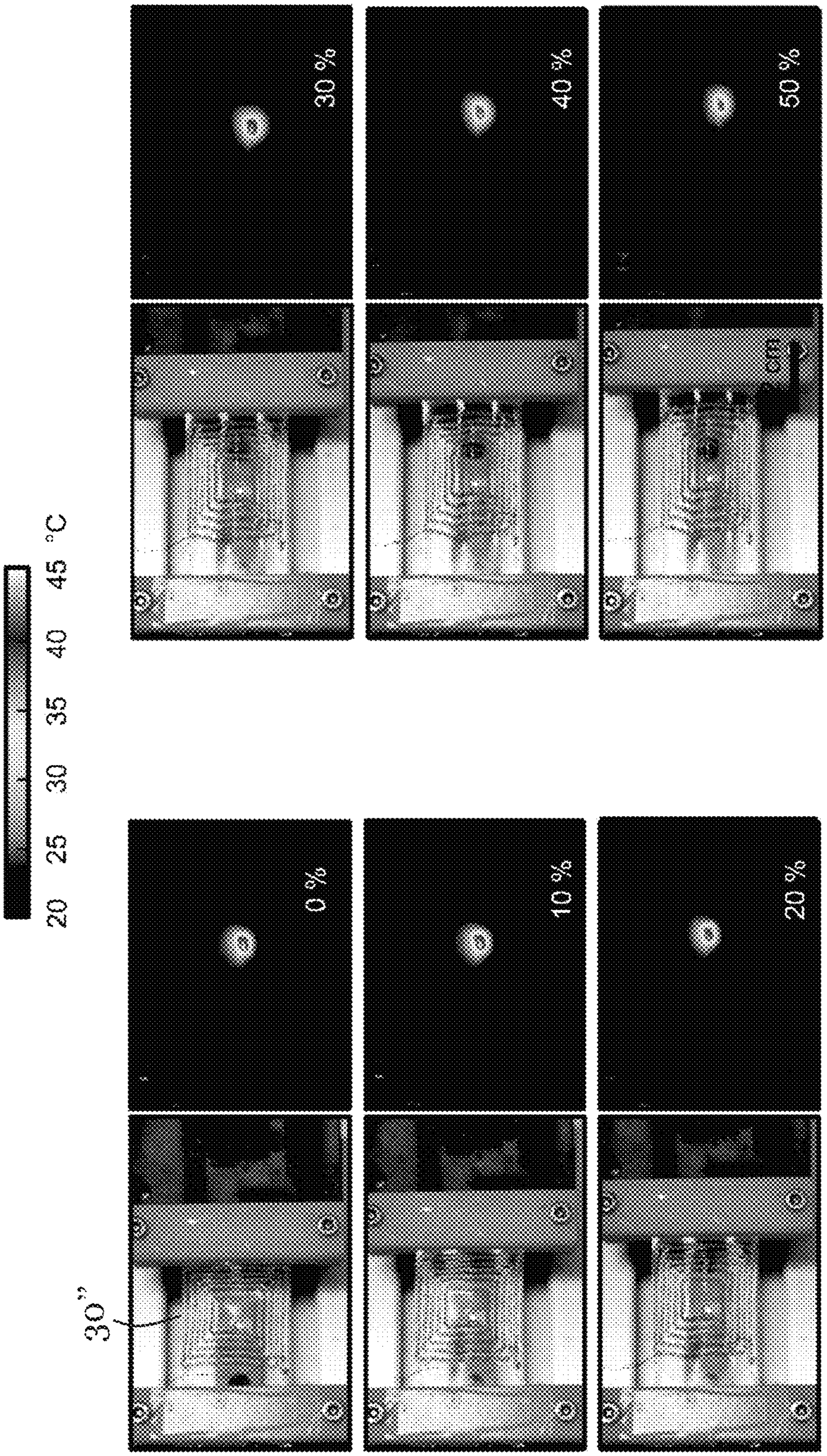
FIG. 21 shows images and corresponding infrared images of the wearable electronic device under stretching from 0% to 50%.

The stretchability of the device 30", or the coating 300", is also investigated. In this example, temperature measurements are taken when the device is being stretched, and a wired power supply is used (instead of a wireless power supply) to reduce the influence of the diameter variation of the wireless coil on the power of the wireless RF method. The device 30" is directly connected with a waveform generator by enameled wire. Then the device 30" is fixed (with the PDMS layer facing upward) at the instrument using a chuck for stretching the device from 5% to 50% (speed: 7 mm/s). In fatigue stretching tests, the device 30" is stretched from 0% to 50% for 75 mins (1000 times). The temperature on the PDMS layer is recorded by an infrared camera after being operated for 15 minutes. The temperature of the device 30" operating with an input power of 160 mW is measured under stretching (extent of stretching ranging from 5% to 50%) for 1000 times. FIG. 21 shows the optical and infrared images of the stretching.

It has been found that the thermal equilibrium temperature of the device 30" without stretching (43.7° C.) is lower than the control device (56.7° C.). On the other hand, under stretching state at 50% as shown in FIG. 21, the temperature of the device 30" (about 42.7° C.) remains close to the temperature (43.7° C.) without stretching for the same input power. The small temperature reduction of the stretched device may originate from the chuck (made of steel) that may conduct heat away from the device, enlarged area under deformation, etc. Both the illumination intensity and device temperature of the device 30" exhibit no significant variation under different extents of stretching. This indicates that the operability of the device 30" and the coating 300'".

FIG. 22 to 26C illustrate an example wearable electronic device 30'" including the radiative cooling coating 300'" in one embodiment. The wearable electronic device 30'" is a wireless photoplethysmography (PPG) sensor with a finger-like configuration. The device 30'" can be used for real-time pulse monitoring.

The device 30'" is made by the following process. First, customized flexible printed circuit board (DingXin Ltd., China) is prepared. The electrical components (i.e., photoplethysmography sensor, microcontroller unit, resistor, and low-dropout regulator) are soldered with solder paste on the flexible printed circuit board. Then, the flexible printed circuit board is placed in the Polyacrylate mold fabricated by 3D printing using commercial digital laser resin printer (HALOT-SKY, CREALITY). The surface of the mold is coated with a 5 μm layer of Parylene C by chemical vapor deposition (CVD) using a Parylene deposition equipment (PDS 2010 421 Labcoter® 2, Specialty Coating Systems Inc.) as isolation molecular layer between the mold and Ecoflex. Then, the uncured Ecoflex that is mixed with about 7 wt % blue dye (Silcpig) is poured into the mold. Then, the mold is covered and the Ecoflex is cured at 60° C. for 30 min in an oven, and then the flexible printed circuit board is peeled off from the mold. After removing PDMS remaining on the top side of the flexible printed circuit board and plasma treatment, the radiative cooling material/coating precursor (such as that described above) is then spin-coated onto the top of the flexible printed circuit board at 200 rpm and baked at 70° C. for 30 minutes. In use, the photoplethysmography sensor coated with the radiative cooling coating 300''' can be attached on a finger, or fingertip, of a user, e.g., using adhesives, fasteners, etc.

Figure 22:
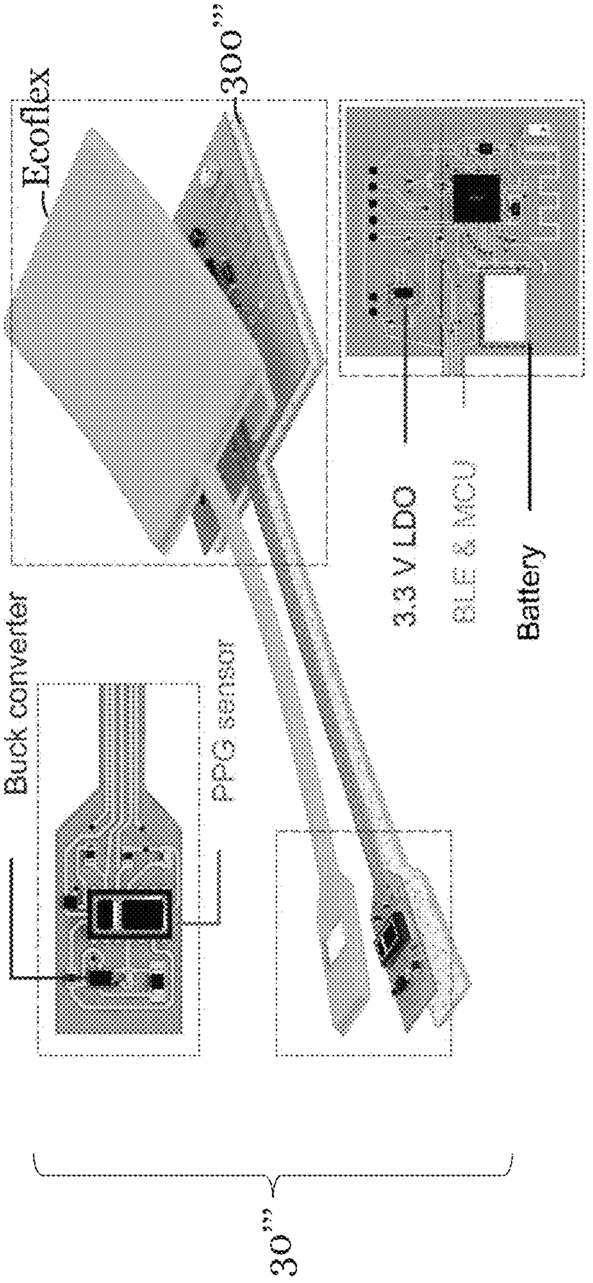
FIG. 22 is a part exploded schematic of a wearable electronic device in one embodiment.
Figure 33:
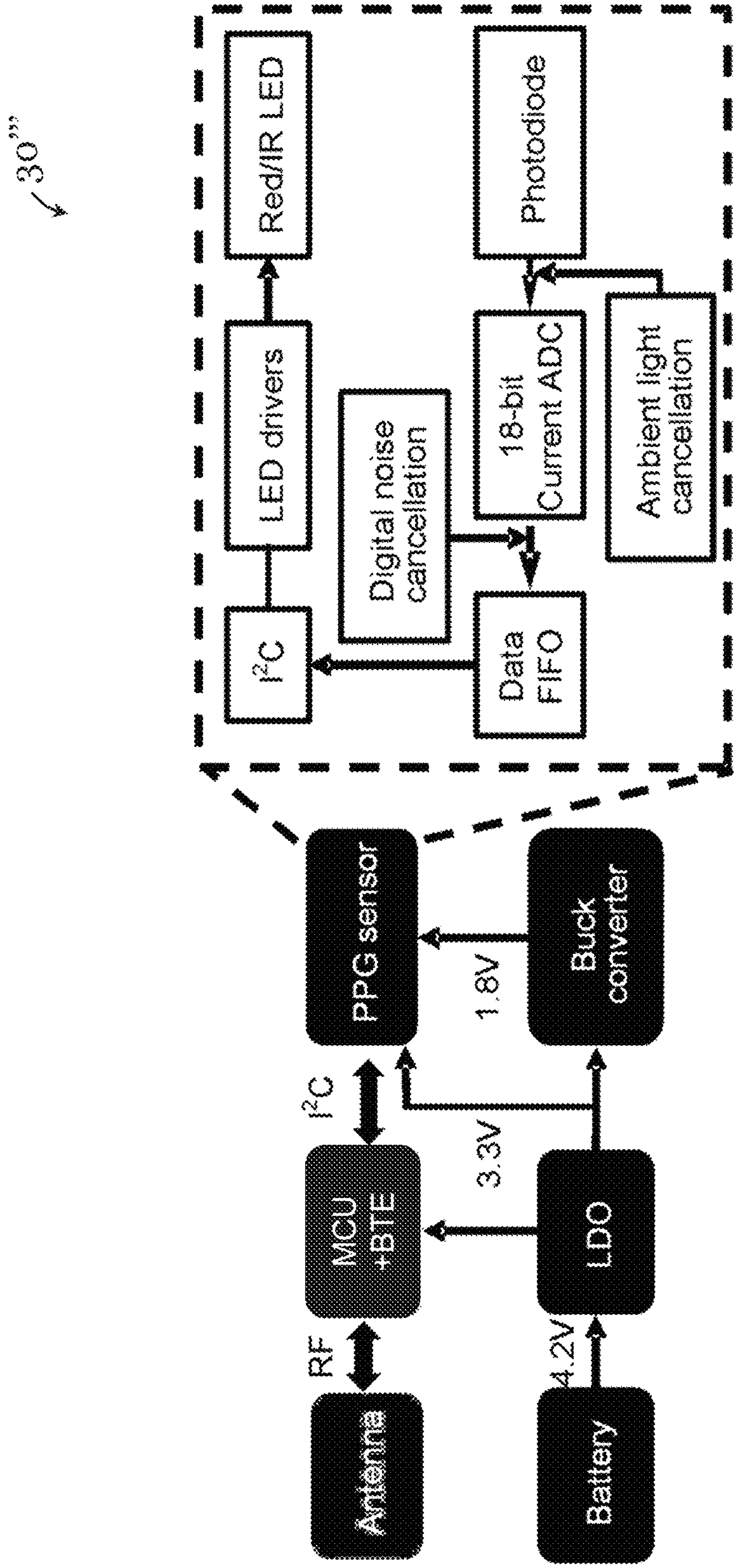
FIG. 33 is a schematic circuit diagram of the wearable electronic device of FIG. 22.

As shown in FIGS. 22 and 33, the device 30''' includes a photoplethysmography (PPG) sensor (MAX30102, Maxim integrated), a Bluetooth wireless Microcontroller Unit (MCU) (CC2640R2F, TI), a Low-Dropout Regulator (LDO) (TPS76933, TI), and a buck converter (TPS622314, TI), arranged on a flexible circuit board. These components are powered by a power supply such as lithium battery. The power from the battery can be converted to 3.3V by the LDO to power the MCU and the light-emitting diodes (LEDs) in the photoplethysmography sensor. The buck converter can convert the 3.3V voltage to 1.8V as an analog power supply of the photoplethysmography sensor. The MCU can communicate with the photoplethysmography sensor through an inter-integrated circuit (I2C) bus for data (e.g., measurements) collection. The MCU can process the data and obtain information of the photoplethysmography signal. By using the Bluetooth Low Energy (BLE) module built into the MCU, the device 30''' can transmit the collected data to a mobile phone in real time. The device 30''' includes a body with two end portions connected by a central elongated portion. One of the end portion (larger, generally rectangular) includes the circuit portion with the LDO, the Bluetooth MCU, and the battery. Another one of the end portion (smaller, generally rectangular) includes the circuit portion with the buck converter and the photoplethysmography sensor. Conductors are arranged on the flexible circuit board, and are run through the elongated portion, to operably connect these components. The circuit board and associated components are sandwiched between the substrate layer (ecoflex) and the coating 300'''. The substrate layer has a cut-out or opening at the location corresponding to the photoplethysmography sensor to expose it for detection. The top surface of the photoplethysmography sensor may be coated with 0.5 mm thick coating 300''. In operation, when the device 30''' is exposed to outdoor or harsh environment, both sunlight light and hot wind can heat the device up quickly. Therefore, in this example, the coating 300''' can reduce or prevent solar absorption and thermal conduction (to prevent heat generation) while boosting thermal radiation for heat dissipation.

Figure 23:
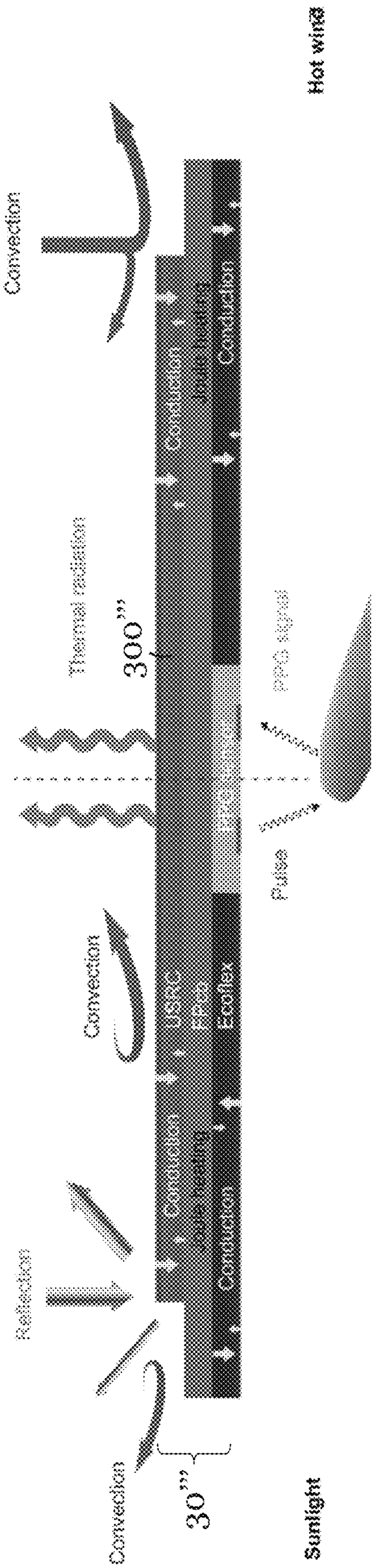
FIG. 23 is a schematic diagram illustrating the thermal exchange processes of the wearable electronic device of FIG. 22.

FIG. 23 illustrates the thermal exchange processes of the wearable electronic device 30'''. As shown in FIG. 23, the relatively low thermal conductivity of the coating 300''' can slow the thermal exchange between the external heat source and the device 30''', and prevent rapid temperature variation (e.g., rise) of the device 30'''. As a result, the device 30''' is more stable. The surface of the coating 300''' can be modified to impart hydrophobic property (based on the above mentioned methods) to further improve the stability and functionality of the device 30''' (e.g., achieve effective water/sweat resistance features).

Figure 24A:
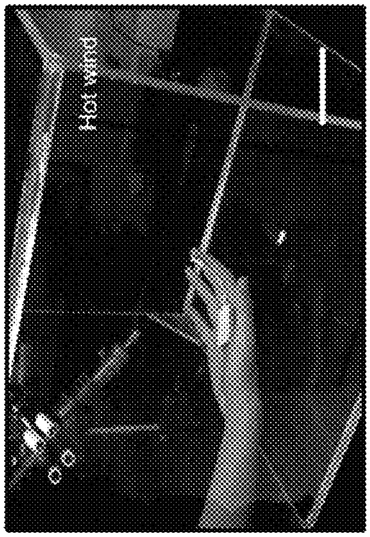
FIG. 24A is an image showing the wearable electronic device of FIG. 22 operating under hot wind.
Figure 24B:
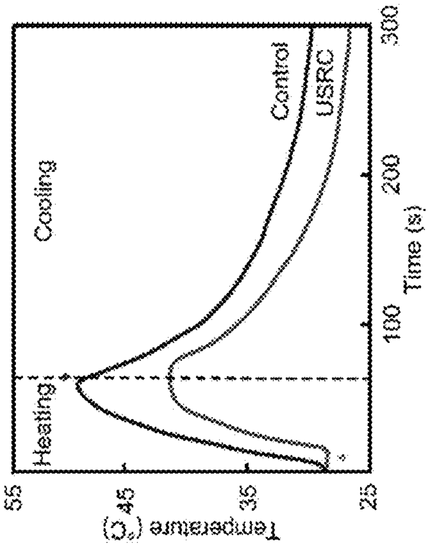
FIG. 24B is a graph showing the temperature variation of the wearable electronic device when the wearable electronic device of FIG. 22 is operating under hot wind.
Figure 24C:
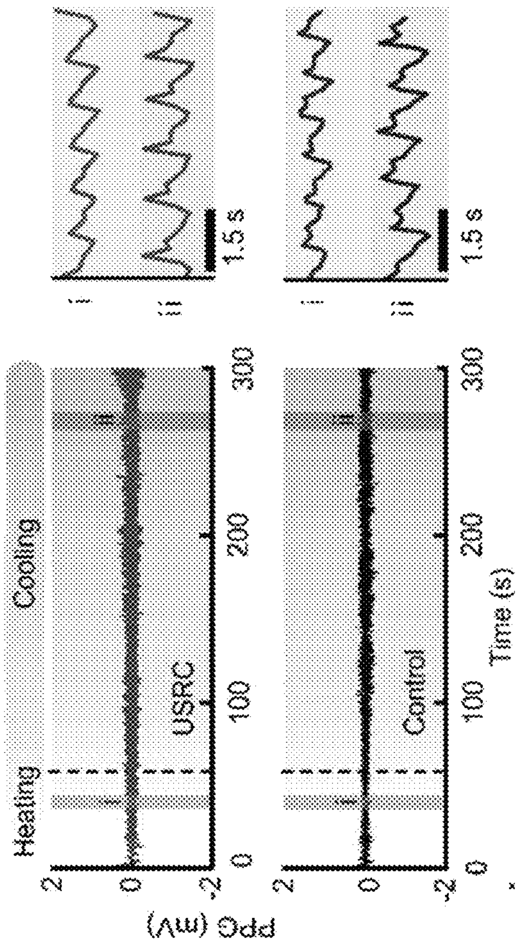
FIG. 24C shows the photoplethysmography (PPG) signals (from fingertip of user) monitored by the wearable electronic device when the wearable electronic device of FIG. 22 is operating under hot wind.

To investigate the function of the coating 300''' in the device 30''' when the device 30''' is exposed to external heat sources, photoplethysmography signal and device temperature are recorded under two situations: exposed under sunlight simulator (FIGS. 25A to 25C) and blown by hot wind (FIGS. 24A to 24C). In the tests, the power intensity of the sunlight light simulator is 1000 W/m$^2$, and the air temperature and flow rate of the wind are 55° C. and 5 L/min, respectively. The temperature measurement method for the device 30''' is based on temperature sensing using a temperature sensor integrated inside the microcontroller unit.

The measurement environment for the device 30''' includes both indoor and outdoor situations. For the temperature measurement of the device under sunlight light exposure, a sunlight light simulator (CEL-PF300-T10, CEAuLight Co., Ltd) is used for irradiating the back surface of the fabricated device 30''' with power of 1000 W/m$^2$ during signal monitoring. The power of the exposure is 1000 W/m$^2$ and the irradiation lasts for 60 seconds. The distance between the simulator and the device is 10 cm. For the blown-by-hot-wind test, a hot air gun is used for heating the back surface of the fabricated device 30''' during the signal monitoring (the air temperature and flow rate of the wind are 55° C. and 5 L/min, respectively). The test is performed for 300 seconds, including 60 seconds of heating and 240 seconds of cooling (FIGS. 24B and 24C) at forearm. The distance between the hot air gun and the device is 30 cm.

Figure 25A:
FIG. 25A is an image showing the wearable electronic device of FIG. 22 operating under sunlight light exposure.
Figure 25B:
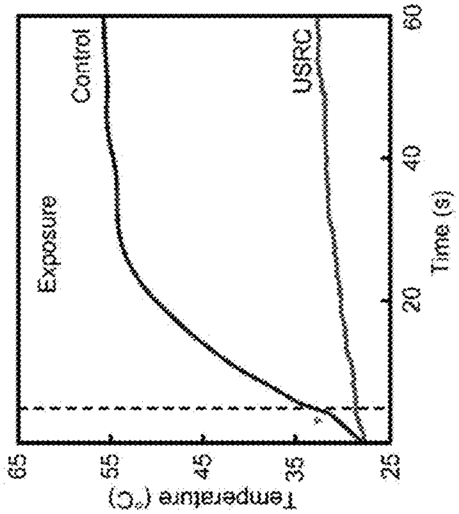
FIG. 25B is a graph showing the temperature variation of the wearable electronic device when the wearable electronic device of FIG. 22 is operating under sunlight light exposure.
Figure 25C:
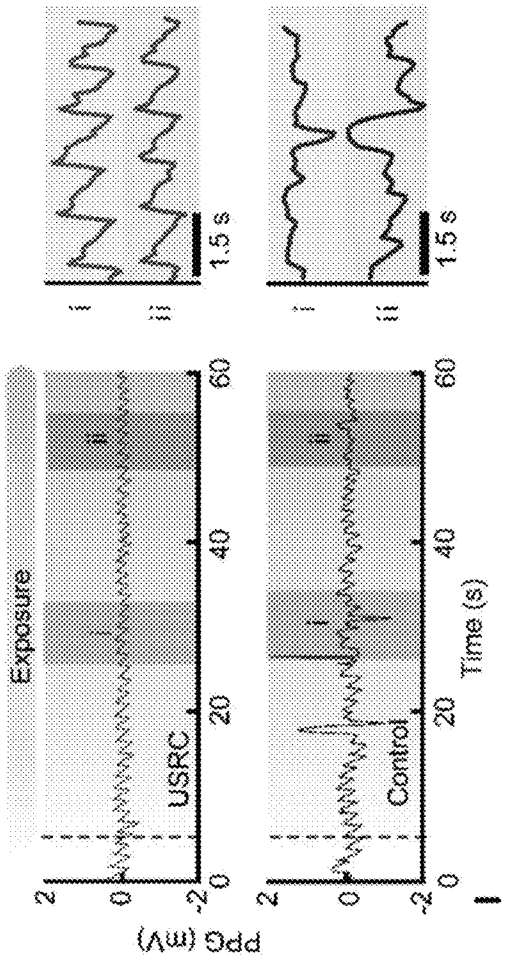
FIG. 25C shows the photoplethysmography (PPG) signals (from fingertip of user) monitored by the wearable electronic device when the wearable electronic device of FIG. 22 is operating under sunlight light exposure.

FIGS. 24A to 24C show the device 30''' operating under hot wind, the temperature variation during the operation, and the photoplethysmography (PPG) signals obtained during the operation. FIGS. 25A to 25C show the device 30''' operating under sunlight light exposure (simulated), the temperature variation during the operation, and the photoplethysmography (PPG) signals obtained during the operation. As shown in FIGS. 24B and 25B, the peak values of the temperature of the device 30''' with the coating 30''' under the two satiations are 40.4° C. under hot wind and 31.8° C. under sunlight light exposure, respectively. Both are lower than the temperature of the control device (without coating 300''') (hot wind: 48.9° C., sunlight light exposure: 58.7° C.). For the situation of exposure by sunlight light, the device 30''' can reflect sunlight light efficiently to reduce the solar heating and suppress the device temperature. As hot wind is present, the hollow glass microparticles in the coating are applied as a thermal barrier which can weaken thermal conduction to prevent heat transfer from the external source heated top surface to the inner parts of the device. Therefore, the coating 300''' can decrease the device 30''' temperature to improve the signal to noise ratio as the light sources for photoplethysmography signal acquisition are susceptible to the device temperature. FIGS. 24C and 25C reveal the photoplethysmography signals recorded under the external heat sources in the two situations. It can be seen that three distinct peaks that are clearly present for the device 30''' are absent in the control device. The missing of characteristic peaks and aperiodic change of the PPG signals in the control device may indicate the control device fails to monitor PPG signals in outdoor ambient environment in this example.

To investigate the function of the coating 300''' in the device 30''' when the device 30''' is exposed to outdoor environment, a temperature of the device 30''' is measured indoor, outdoor under shade, then outdoor under sunlight exposure, during the monitoring of photoplethysmography signal from the user. In this test, the user (with device 30''' mounted to hand and photoplethysmography sensor mounted to finger or fingertip) first stands indoor for 100 seconds, then walks outdoor and stands under a shade for 100 seconds, and then walks out of the shade and stands under sunlight exposure for 100 seconds. The hands of user are moved/drooped naturally during the monitoring of photoplethysmography signal.

Figure 26A:
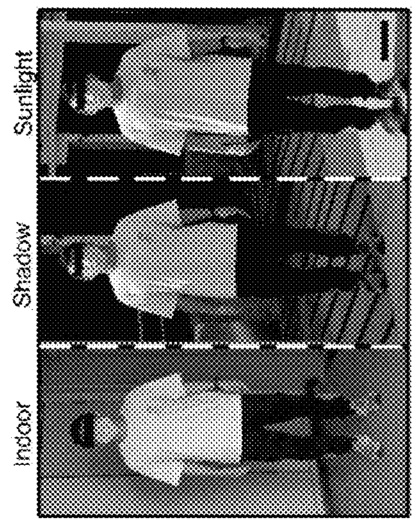
FIG. 26A is an image showing the wearable electronic device of FIG. 22 being worn by a user who walks from indoor to outdoor (from outdoor shadow to outdoor sunlight light)
Figure 26B:
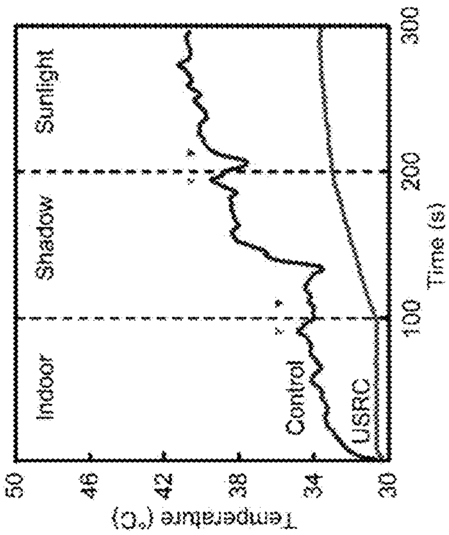
FIG. 26B is a graph showing the temperature variation of the wearable electronic device when the wearable electronic device of FIG. 22 is operating from indoor to outdoor (from outdoor shadow to outdoor sunlight light)
Figure 26C:
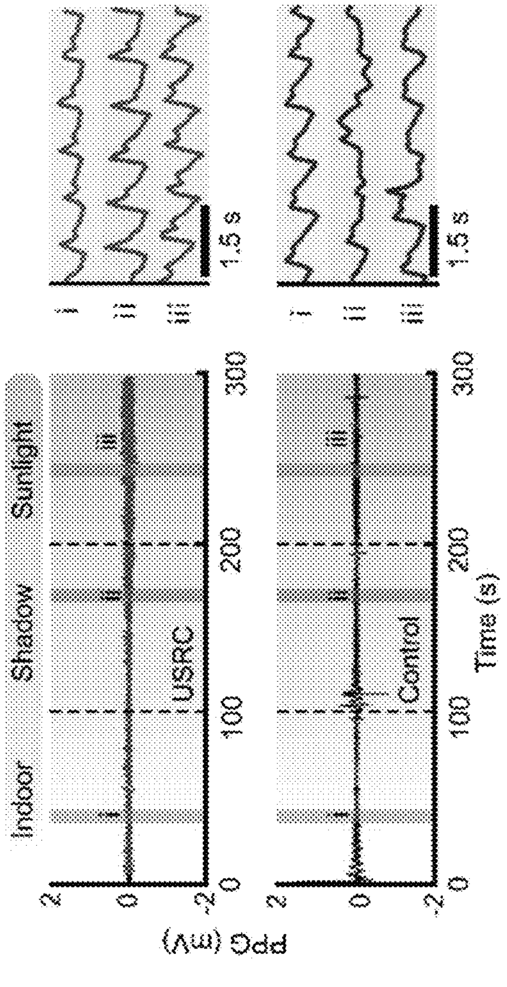
FIG. 26C shows the photoplethysmography (PPG) signals (from fingertip of user) monitored by the wearable electronic device when the wearable electronic device of FIG. 22 is operating from indoor to outdoor (from outdoor shadow to outdoor sunlight light)

As shown in FIG. 26B, the temperature of the device 30''' (33.8° C.) is significantly lower than the control device (42.1° C.) in outdoor. Also, the temperature curve for the control device drastically fluctuates due to natural wind. As shown in FIG. 26C, the photoplethysmography signal obtained from the device 30''' is more stable and distinct than the control device. This indicates that the device 30''' with coating 300''' can effectively reduce or minimize the influence of external environment on the device 30'''.

The radiative cooling coating in some embodiments of the invention (e.g., the above embodiments of the invention) can be used as a radiative cooling interface for skin/epidermal electronics. Hence, in some embodiments, the ultra-thin, soft, radiative cooling coating ("USRC") may provide an ultra-thin, soft, radiative cooling interface ("USRI").

Figure 28:
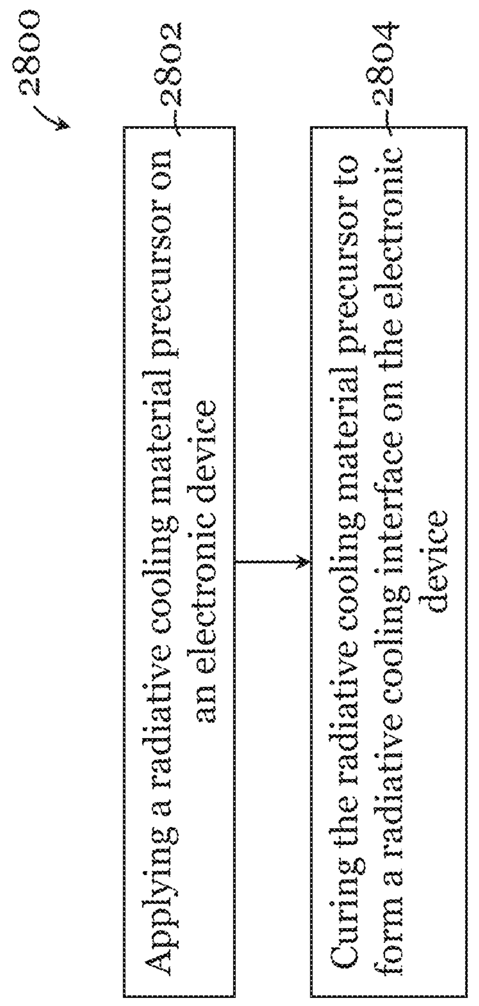
FIG. 28 is a schematic diagram illustrating a method for making a wearable electronic device with a radiative cooling interface in some embodiments of the invention.

FIG. 28 shows a method 2800 for making a wearable electronic device with a radiative cooling interface in some embodiments of the invention.

The method 2800 generally includes, in step 2802, applying a radiative cooling material precursor on an electronic device (i.e., at least part of the electronic device). The radiative cooling material precursor may be any of the radiative cooling material precursor embodiments of the invention. The electronic device in step 2802 may include a PCB (e.g., an integrated flexible PCB), resistive heating metallic element(s) (e.g., wire(s)), circuit(s) components, sensor(s), etc. The electronic device in step 2802 may be inherently flexible (has a flexible body). In step 2802, the applying may include spin-coating, spraying, etc. of the radiative cooling material precursor on the electronic device. In some embodiments, prior to step 2802, an emulsion (e.g., aqueous emulsion) of a polymer matrix and one or more materials are mixed to form a mixture, which corresponds to the radiative cooling material precursor. In some embodiments, prior to step 2802, a plasma treatment is performed on the electronic device to improve the effectiveness of the application of the radiative cooling material precursor on the electronic device.

The method 2800 also includes, in step 2804, curing the applied radiative cooling material precursor on the electronic device, to form a radiative cooling interface on the electronic device, thus forming a wearable electronic device, such as a skin/epidermal electronic device. In some examples, the curing includes baking the radiative cooling material precursor, e.g., on a hot plate. The radiative cooling interface formed is flexible and is integrated with the wearable electronic device. In examples in which spin coating is used in step 2802, the spin speed may be controlled to affect the thickness of the radiative cooling interface.

Figure 29:
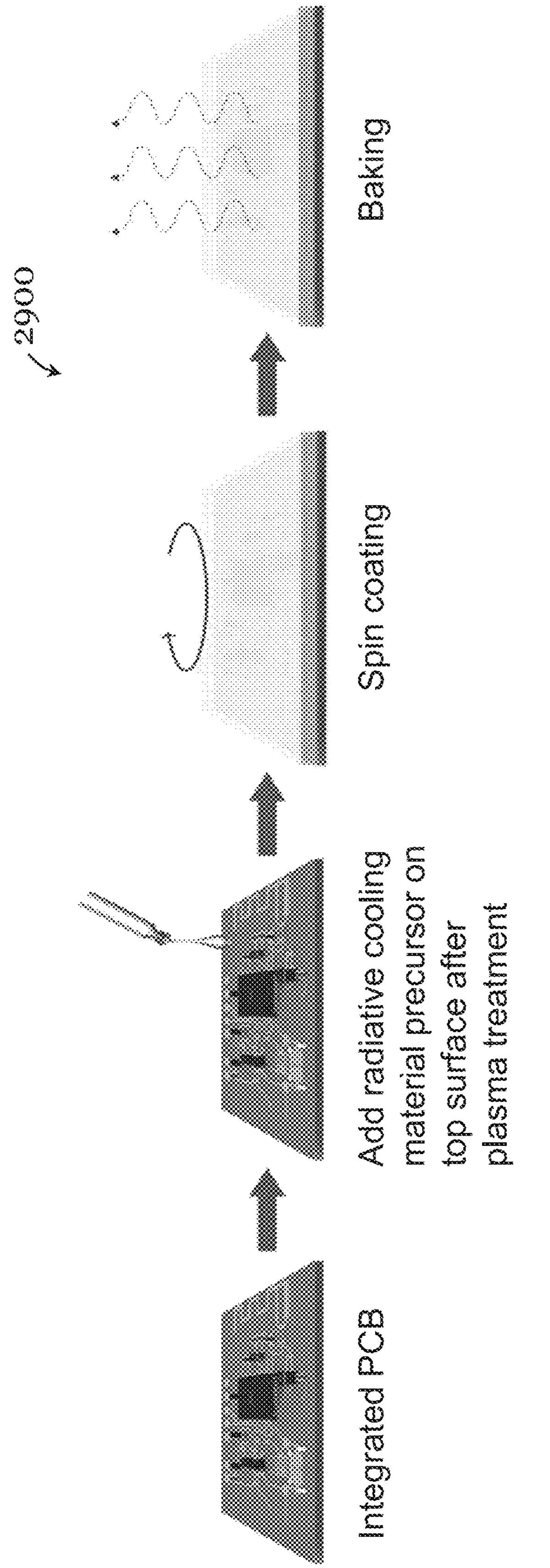
FIG. 29 is a schematic diagram illustrating a method for making a wearable electronic device with a radiative cooling interface in some embodiments of the invention.

FIG. 29 shows a method 2900 for making a wearable electronic device with a radiative cooling interface in some embodiments of the invention. The method 2900 in these embodiments can be considered as a specific example of the method 2800. In the embodiments of method 2900, an integrated PCB (PCB integrated with electronic components) is obtained. Then, plasma treatment is performed on the integrated PCB. Afterwards, the radiative cooling material precursor is applied to and spin coated on a top surface of the integrated PCB. Finally, the integrated PCB with spin coated radiative cooling material precursor is baked (e.g., using a hot plate, in one example, at 70° C. for 30 minutes) to form a radiative cooling interface on the electronic device. In this example, the radiative cooling interface can be used as an encapsulation or cover to substantially cover at least the top surface of the integrated PCB. The radiative cooling interface may be any radiative cooling interface or coating in embodiments of the invention.

Figure 30:
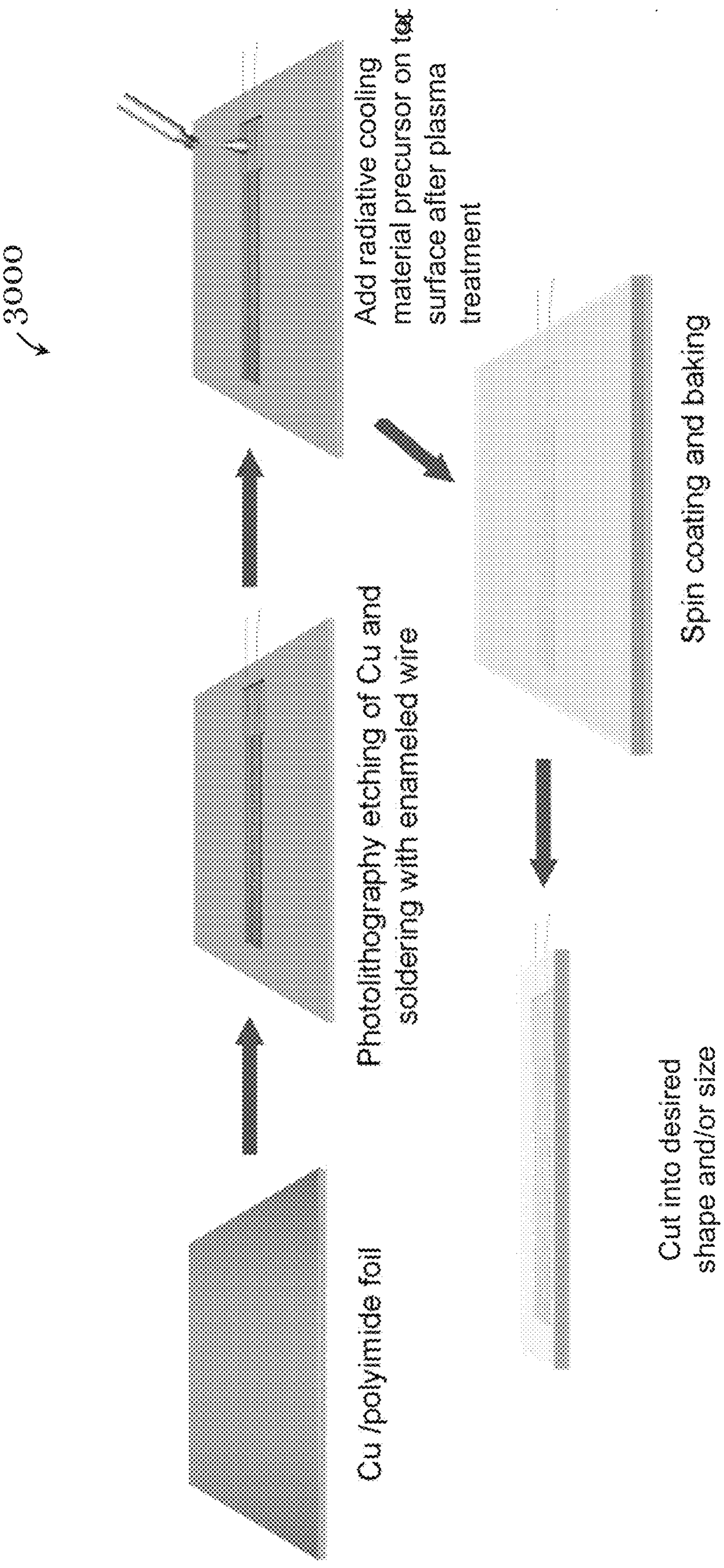
FIG. 30 is a schematic diagram illustrating a method for making a wearable electronic device with a radiative cooling interface in some embodiments of the invention.

FIG. 30 shows a method 3000 for making a wearable electronic device with a radiative cooling interface in some embodiments of the invention. The method 3000 in these embodiments can be considered as a specific example of the method 2800. In the embodiments of method 3000, a copper (Cu)/polyimide foil, optionally with photoresist on top, is first obtained. The assembly may then be soft baked. Then, Cu is etched using photolithography techniques to form a flexible heating wire (that can be resistively heated) and enameled wire is soldered to the flexible heating wire. Plasma treatment may then be performed. Afterwards, the radiative cooling material precursor is applied to and spin coated on a top surface of the flexible heating wire, and baked to form a radiative cooling interface on the flexible heating wire. Optionally, the assembly can then be cut in to desirable size and/or shape.

Figure 31:
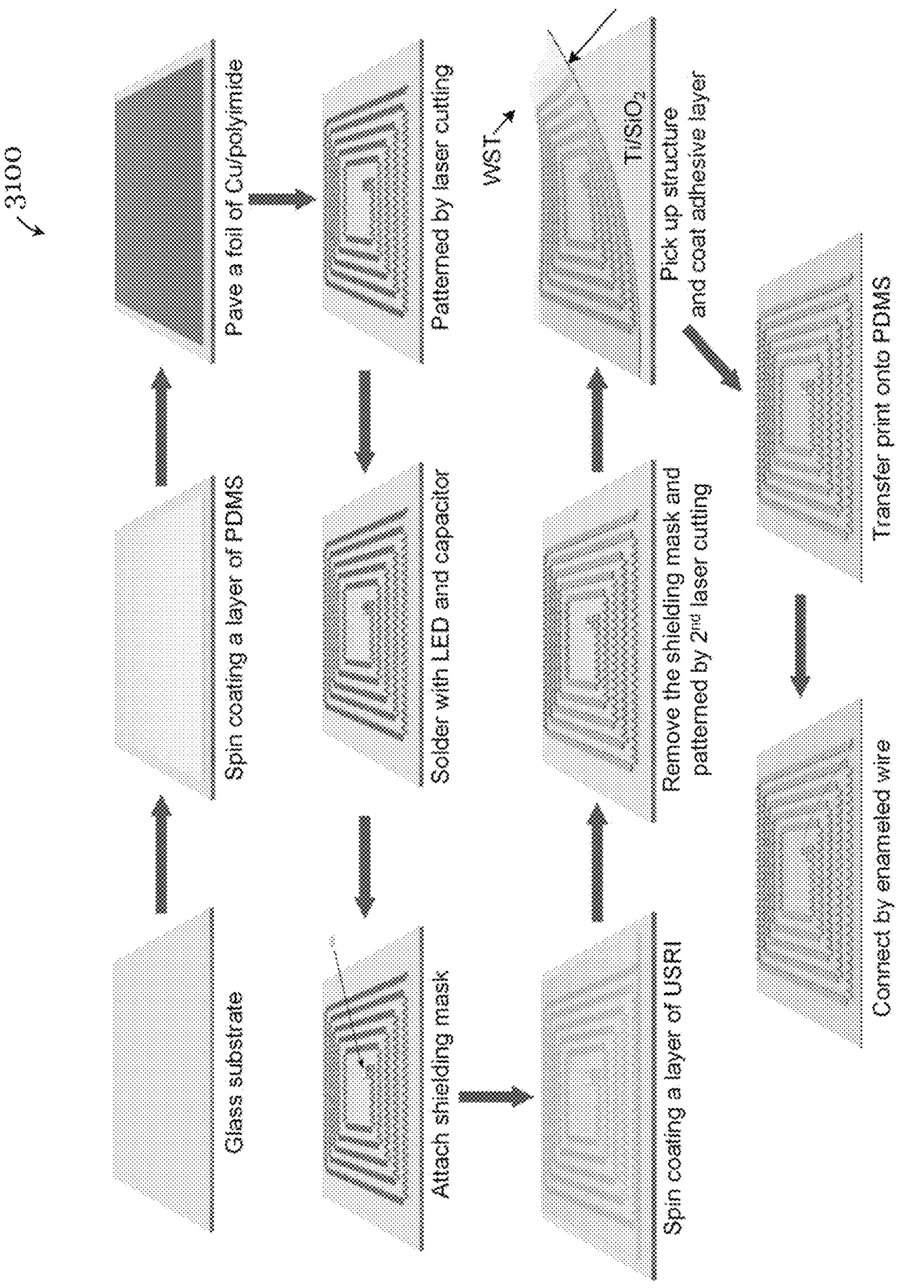
FIG. 31 is a schematic diagram illustrating a method for making a wearable electronic device with a radiative cooling interface in some embodiments of the invention.

FIG. 31 shows a method 3100 for making a wearable electronic device with a radiative cooling interface in some embodiments of the invention. The method 3100 in these embodiments can be considered as a specific example of the method 2800. In the embodiments of method 3100, a glass substrate is obtained, then a layer pf PDMS is spin coated on the glass substrate. Then a copper (Cu) foil/polyimide (30 μm) is placed on the layer of PDMS and then patterned by laser cutting to form serpentine coil wire. LED and capacitor are soldered to the patterned serpentine coil wire. A shielding mask is applied on top of the LED. Optionally plasma treatment is performed. Then, the radiative cooling material precursor is applied to and spin coated on a top surface of the patterned serpentine coil wire, to form the radiative cooling interface. Next, the shielding mask is removed and the fabricated coil integrated with the spin-coated radiative cooling material precursor is patterned by laser cutting to remove unwanted radiative cooling interface portion/layer. After the laser cutting, a water-soluble tape (WST) is used to pick up the assembly (coil with radiative cooling material precursor on top). Ti/$SiO_2$ is deposited on the bottom side of the water-soluble tape to form an adhesive layer for bonding. Afterwards, the water-soluble tape is treated together with another PDMS layer to form a chemical combination between $SiO_2$ layer and PDMS when the water-soluble tape and the fabricated device are mounted onto the PDMS. The transferred pattern is then immersed in water for removing the water-soluble tape, and the assembly is then baked. The enameled wired is then connected.

Figure 32:
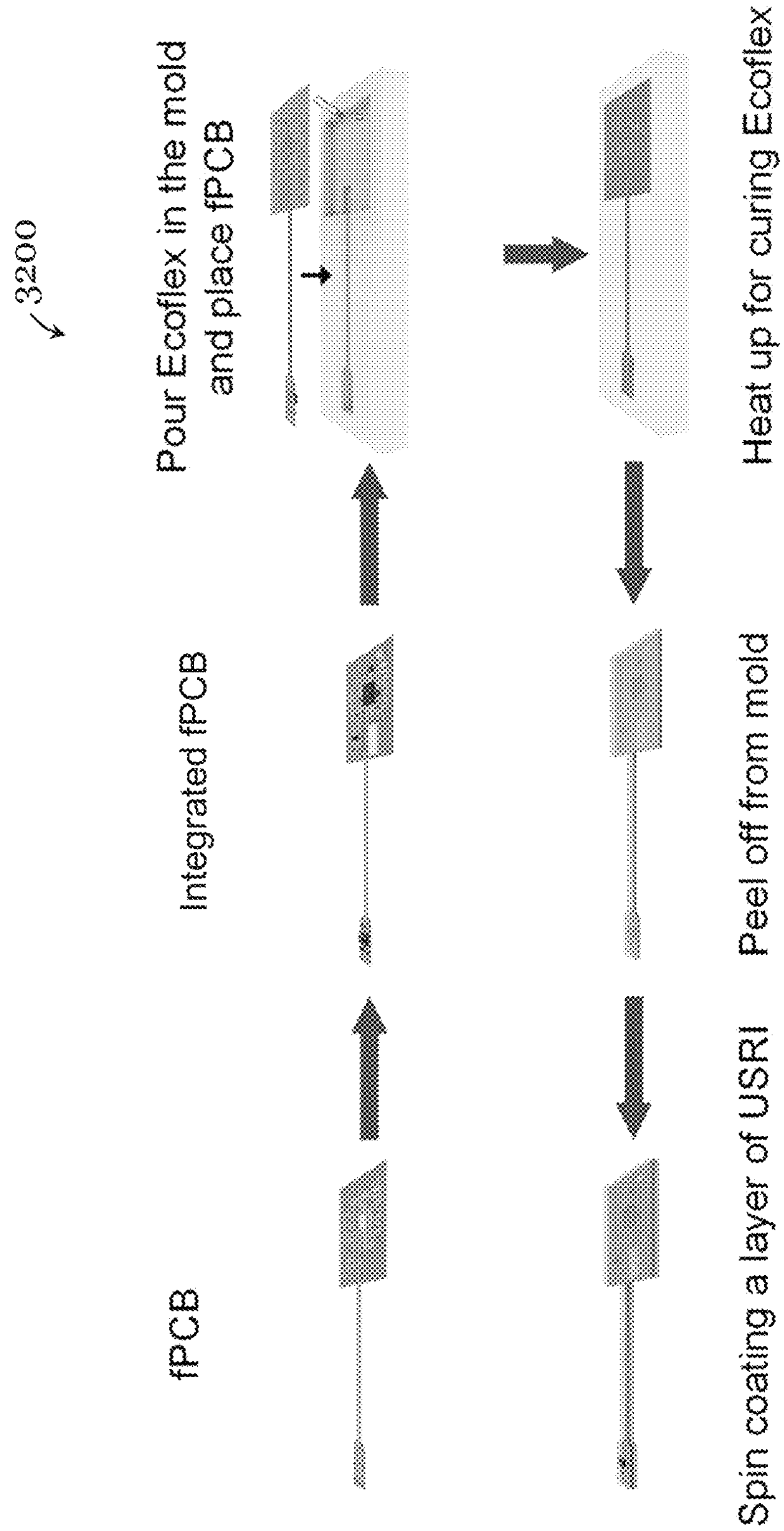
FIG. 32 is a schematic diagram illustrating a method for making a wearable electronic device with a radiative cooling interface in some embodiments of the invention.

FIG. 32 shows a method 3200 for making a wearable electronic device with a radiative cooling interface in some embodiments of the invention. The method 3200 in these embodiments can be considered as a specific example of the method 2800. In the embodiments of method 3200, a flexible PCB is first obtained. Then the flexible PCB is processed to form an integrated flexible PCB. Then, Ecoflex is poured in a mold and the integrated flexible PCB is placed on the Ecoflex. Heat is then applied to cure the Ecoflex, and then the flexible printed circuit board is peeled off from the mold. The PDMS remaining on the top side of the flexible PCB may be removed and plasma treatment may be performed. Then the radiative cooling material precursor is spin-coated onto the top of the flexible PCB and baked, to form a radiative cooling interface.

In some embodiments, there is provided a thermal management strategy for skin electronics. The thermal management strategy makes use of a radiative cooling interface, preferably an ultra-thin, soft, radiative cooling interface, which facilitates cooling in skin electronics through both radiative and non-radiative heat transfer. In some embodiments, the radiative cooling interface is light and intrinsically flexible, hence can be used as a conformable sealing layer and can be readily integrated with skin electronics. In some embodiments, the radiative cooling interface may be a micrometer-level or -order thick coating layer that exhibits infrared emittance and high solar reflectance and robust mechanical flexibility. The intrinsically flexible nature of the radiative cooling interface allows the electronics to undergo stable cooling even when the interface is deformed (e.g., bent, twisted, folded, stretched, etc.). Performance of skin electronics may be significantly improved when integrated with the radiative cooling interface, which provides efficient passive cooling capacity and non-radiative thermal design. In some embodiments the radiative cooling interface can be used for thermal management in advanced wearable electronics such as integrated circuits, high-power consumption electronics, wireless epidermal electronics, etc.

In some examples, since the fluorescent contribution cannot be distinguished using a commercial UV/VIS/NIR spectrometer, a calorimetric method is used to quantitatively evaluate the effective solar reflectance (ESR) of the radiative cooling interface or coating. Assuming an approximated radiative heat transfer coefficient as $$h_r \approx 4\epsilon\sigma T_{amb}^3,$$

the energy balance at equilibrium temperature $T_{eq}$ can be expressed as:

$$(1 - ESR)I_{solar} \doteq h(T_{eq} - T_{amb}) + h_r(T_{eq} - T_{atm})$$

where $I_{solar}$ is the solar intensity, $T_{atm}$ is the temperature of the atmosphere and $T_{amb} \approx T_{atm}$. The relationship between the equilibrium temperature and effective solar reflectance (or solar reflectance if no fluorescent contribution) would be:

$$T_{eq} \cong \frac{[(1 - ESR)I_{solar} + (h + h_r)T_{amb}]}{h + h_r} = a \cdot ESR + b$$

where a and b are the simplified environmental parameters. Through linear fitting of the equilibrium temperature and solar reflectance of 9 reference samples (R1-R9, no fluorescence pigments), the relationship is obtained in one example as $T_{eq} = -0.085 \cdot ESR + 31.69$ and thereby the fitted ESR of 0.9126 for the radiative cooling interface or coating.

In the Figures, where appropriate, standard errors in plots are represented by error bars. The Student's two-tailed, unpaired t-test is adopted to compare different groups/devices with the corresponding p-value. Asterisk in a plot may represent a significant difference between two data groups ($p<0.05$), unless otherwise specified.

The invention has provided a radiative cooling material that is suitable for use with wearable electronic devices for facilitating cooling of the device. Some of the embodiments have provided a thin, soft, radiative cooling coating with both radiative and non-radiative design for thermal management of wearable and stretchable electronics, such as skin/epidermal electronics. The thermal management capacity, the cooling effect, wearable property, stretchability and performance improvement are investigated using example wearable electronic devices for applications such as cooling resistance wires, improving device performance, integration with wireless communication, wearable and flexible display, continuous stable physiological bio-signal monitoring, etc. In one example, significant temperature reduction could be obtained with the coating volume of only 30 μL (achieving a 22° C. temperature reduction, from 64° C. to 44° C., for skin/epidermal electronics). In some examples, the radiative cooling effect can be improved by increasing the thickness/area of the coating. Performance and energy efficiency of devices with the coating can generally be enhanced. In one example, the passive cooling effect of the coating can promote a 50% improvement in the efficiency of wireless power transfer in a skin/epidermal lighting device. In some examples, the coating could help reduce signal noise of the skin/epidermal sensors by effectively suppressing the thermal exchange with external heat sources. In some examples, the coating with low thermal conductivity can avoid, reduce, or prevent interference of the environment (i.e., external heat sources) on the device, hence can suppress or reduce signal fluctuation for some devices. The coating, or more generally the radiative cooling material, can be used in various wearable electronic devices for various applications such as medical (e.g., clinical monitoring, diagnosis), communication (e.g., wireless communication) and entertainment (e.g., VR-AR) applications.

It will be appreciated by persons skilled in the art that variations and/or modifications may be made to the invention as shown in the specific embodiments to provide other embodiments of the invention. The described embodiments of the invention, including the "USRC" and "USRI" embodiments, should therefore be considered in all respects as illustrative, not restrictive. Example optional features of various aspects of the invention are set forth in the summary section. Some embodiments of the invention may include one or more of the optional features. Some embodiments of the invention may lack one or more of the optional features. The radiative cooling material and structure in this invention can be applied to facilitate cooling of other structure(s) and/or device(s), including but not limited to electronic device that may be portable.

The invention claimed is:

1. A wearable electronic device comprising: a flexible substrate; a radiative cooling interface coupled to the substrate for facilitating cooling of the wearable electronic device; a heat source located between the substrate and the radiative cooling interface or located on a side of the substrate, wherein the radiative cooling interface is flexible and has a thickness in the range from 10 μm to 600 μm, and wherein the radiative cooling interface is a radiative cooling material comprising: a polymeric matrix and one or more materials dispersed in the polymeric matrix; wherein the radiative cooling material is operable facilitate reflection of solar radiation in at least some solar spectrum wavelengths when exposed to solar radiation, and facilitate emission of thermal radiation in at least some infrared spectrum wavelengths, wherein the polymeric matrix is substantially transparent or translucent to the solar radiation and emissive in the at least some infrared spectrum wavelengths; and wherein the one or more materials include: a first material for facilitating emission of the thermal radiation in the at least some infrared spectrum wavelengths; and a second material, which is not SiO2, for facilitating reflection of the solar radiation in the at least some solar spectrum wavelengths, wherein the polymeric matrix has a first refractive index and the second material has a second refractive index larger than the first refractive index, and the first refractive index is 1.5, or less and the second refractive index is 1.5, or above.

2. The wearable electronic device of claim 1, wherein the at least some infrared spectrum wavelengths comprise at least some mid-infrared spectrum wavelengths and at least some far-infrared spectrum wavelengths; and wherein the at least some solar spectrum wavelengths comprise at least some visible spectrum wavelengths and at least some near-infrared spectrum wavelengths.

3. The wearable electronic device of claim 1, wherein the polymeric matrix comprises at least one of: polystyrene-acrylic, polydimethylsiloxane (PDMS), poly (methyl methacrylate) (PMMA), polyvinylidene fluoride (PVDF), and polytetrafluoroethylene (PTFE).

4. The wearable electronic device of claim 1,
wherein the first material comprises at least one of: $SiO_2$, $Si_3N_4$, LiF, and SiC; and
wherein the first material is in the form of particles.

5. The wearable electronic device of claim 4, wherein at least some of the particles are hydrophobic.

6. The wearable electronic device of claim 5, wherein the at least some of the particles have hydrophobic coatings.

7. The wearable electronic device of claim 4, wherein the particles of the first material are microparticles, with an average diameter of about 30 μm to about 60 μm, or about 40 μm to about 50 μm.

8. The wearable electronic device of claim 7, wherein the microparticles are hollow, with a shell and gas contained in the shell.

9. The wearable electronic device of claim 1, wherein the second material comprises a semiconductor material with an optical bandgap of at least 2.5 eV.

10. The wearable electronic device of claim 9, wherein the semiconductor material comprises a metal oxide.

11. The wearable electronic device of claim 10,
wherein the metal oxide comprises at least one of: $TiO_2$, $CaCo_3$, $BaSO_4$, ZnO, $ZrO_2$, and $Al_2O_3$; and
wherein the second material is in the form of particles.

12. The wearable electronic device of claim 11, wherein the particles are nanoparticles with an average diameter of about 200 nm to about 800 nm, about 300 nm to about 600 nm, about 400 nm to about 500 nm, or about 440 nm to about 460 nm.

13. The wearable electronic device of claim 12, wherein the nanoparticles are of different sizes or diameters, and the different sizes or diameters are distributed generally following a Guassian distribution.

14. The wearable electronic device of claim 1, wherein the one or more materials further comprise:
a third material for facilitating conversion of the solar radiation in at least some ultraviolet spectrum wavelengths into at least some visible spectrum wavelengths.

15. The wearable electronic device of claim 14, wherein the third material comprises fluorescent pigments.

16. The wearable electronic device of claim 15, wherein the fluorescent pigments comprises at least one of: $SrAl_2O_4$:$Eu^{2+}$, $Dy^{3+}$, $Yb^{3+}$ and $BaMgAl_{10}O_{17}$:$Eu^{2+}$.

17. The wearable electronic device of claim 15, wherein the third material is in the form of microparticles, with an average diameter of about 20 μm to about 80 μm, about 40 μm to about 60 μm, or about 50 μm.

18. The wearable electronic device of claim 14,
wherein the polymeric matrix comprises polystyrene-acrylic;
wherein the first material comprises $SiO_2$ microparticles;
wherein the second material comprises $TiO_2$ nanoparticles; and
wherein the third material comprises $SrAl_2O_4$:$Eu^{2+}$, $Dy^{3+}$, $Yb^{3+}$ fluorescent pigment.

19. The wearable electronic device of claim 14, wherein:
a weight percentage of the polymeric matrix in the radiative cooling material is about 30 wt % to about 40 wt %;
a weight percentage of the first material in the radiative cooling material is about 4 wt % to about 10 wt %;
a weight percentage of the second material in the radiative cooling material is about 25 wt % to about 40 wt %; and
a weight percentage of the third material in the radiative cooling material is about 20 wt % to about 30 wt %.

20. The wearable electronic device of claim 1, wherein the wearable electronic device is a skin or epidermal electronic device.

21. The wearable electronic device of claim 1, wherein the radiative cooling interface is a coating of the wearable electronic device.

22. A method for making a wearable electronic device, comprising:
applying a radiative cooling material precursor on an electronic device; and
curing the radiative cooling material precursor to form a radiative cooling interface on the electronic device, thereby forming the wearable electronic device of claim 1.

23. The wearable electronic device of claim 1, wherein the substrate comprises polyimide and/or PDMS.

24. The wearable electronic device of claim 1, wherein the radiative cooling interface has a thickness in the range from 75 μm to 225 μm.

25. The wearable electronic device of claim 1, wherein the second refractive index is in the range from 1.5 to 2.5.

* * * * *